US012739977B2

(12) United States Patent
Lee

(10) Patent No.: US 12,739,977 B2
(45) Date of Patent: Sep. 15, 2026

(54) SLOT MEMBER AND POWER ELECTRONIC DEVICE INCLUDING SAME

(71) Applicant: LS ELECTRIC CO., LTD., Anyang-si (KR)

(72) Inventor: Su Hyeong Lee, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 114 days.

(21) Appl. No.: 18/843,386

(22) PCT Filed: Jan. 20, 2023

(86) PCT No.: PCT/KR2023/001046

§ 371 (c)(1),
(2) Date: Sep. 3, 2024

(87) PCT Pub. No.: WO2023/167422

PCT Pub. Date: Sep. 7, 2023

(65) Prior Publication Data

US 2025/0185172 A1 Jun. 5, 2025

(30) Foreign Application Priority Data

Mar. 3, 2022 (KR) ........................ 10-2022-0027180

(51) Int. Cl.
*H05K 1/181* (2026.01)
*H05K 7/14* (2006.01)

(52) U.S. Cl.
CPC ........... *H05K 1/181* (2013.01); *H05K 7/1427* (2013.01); *H05K 2201/10015* (2013.01)

(58) Field of Classification Search
CPC ................. H05K 1/181; H05K 7/1427; H05K 2201/10015; H05K 7/1482; H05K 7/103; H01G 2/06; H01G 11/82; H01R 24/50
See application file for complete search history.

(56) References Cited

U.S. PATENT DOCUMENTS 5,181,854 A 1/1993 Masuda
6,552,912 B1 4/2003 Kanazawa et al.
(Continued)

FOREIGN PATENT DOCUMENTS

JP S62008690 U 1/1987
JP 2000060134 A * 2/2000
(Continued)

OTHER PUBLICATIONS

International Search Report for related International Application No. PCT/KR2023/001046; action dated Sep. 7, 2023; (3 pages).
(Continued)

*Primary Examiner* — Xanthia C Relford
(74) *Attorney, Agent, or Firm* — K&L Gates LLP

(57) ABSTRACT

Disclosed are a slot member and a power electronic apparatus including the same. A slot member according to an aspect of the present disclosure may include a slot body on which a capacitor assembly is seated and which supports the capacitor assembly; a gripping portion continuously formed from one end of the slot body; and a capacitor support portion coupled to the slot body and configured to support an edge of the capacitor assembly, wherein the slot body extends in one direction and is inserted into and coupled to an external housing to be withdrawable therefrom, and the gripping portion is disposed to be exposed to the outside of the external housing.

19 Claims, 22 Drawing Sheets

(56) References Cited

U.S. PATENT DOCUMENTS

| | | | | |
|---|---|---|---|---|
| 10,109,419 | B2 * | 10/2018 | Morihara | H02M 7/003 |
| 10,492,324 | B2 | 11/2019 | Miura | |
| 11,856,700 | B2 * | 12/2023 | Ryu | H05K 1/182 |
| 2008/0265586 | A1 * | 10/2008 | Like | H05K 7/20518 361/709 |
| 2018/0242460 | A1 * | 8/2018 | Varga | H01G 9/26 |
| 2019/0006101 | A1 * | 1/2019 | Matsumae | H01G 9/08 |
| 2020/0037454 | A1 * | 1/2020 | Koczwara | H05K 3/301 |
| 2020/0194146 | A1 * | 6/2020 | Moceri | H05K 5/0247 |
| 2021/0345489 | A1 * | 11/2021 | Ryu | H01G 9/06 |
| 2021/0367360 | A1 * | 11/2021 | Chen | H01R 12/7088 |

FOREIGN PATENT DOCUMENTS

| | | | | |
|---|---|---|---|---|
| JP | 2005056169 | A | 3/2005 | |
| JP | 2005064792 | A | 3/2005 | |
| JP | 2007250831 | A | 9/2007 | |
| JP | 2010148197 | A | 7/2010 | |
| JP | 2013098206 | A | 5/2013 | |
| JP | 2015527727 | A | 9/2015 | |
| JP | 2017118041 | A | 6/2017 | |
| JP | 6596673 | B | 10/2019 | |
| JP | 2019186373 | A | 10/2019 | |
| KR | 20020024317 | A | 3/2002 | |
| KR | 20030081601 | A | 10/2003 | |
| KR | 20120014521 | A | 2/2012 | |
| KR | 20140014411 | A | 2/2014 | |
| KR | 20200048376 | A | 5/2020 | |
| KR | 102344788 | B1 | 12/2021 | |
| WO | WO-2019185917 | A1 * | 10/2019 | H02P 29/00 |

OTHER PUBLICATIONS

Written Opinion for related International Application No. PCT/KR2023/001046; action dated Sep. 7, 2023; (4 pages).

Notice of Allowance for related Japanese Application No. 2024-550897; action dated Dec. 2, 2025; (3 pages).

Office Action for related Japanese Application No. 2024-550897; action dated Aug. 5, 2025; (3 pages).

Notice of Allowance for related Korean Application No. 10-2022-0027180; action dated Oct. 21, 2024; (6 pages).

Extended European Search Report for related European Application No. 23763621.2; action dated Mar. 4, 2026; (42 pages).

* cited by examiner

Up
Left
Right
Down
500
512
511
514
512
512
511
514
512
(a)
(b)
200,300,400,500
Up
Rear
Right
Left
Front
Down
300b
S
210
220
300a
500
400

SLOT MEMBER AND POWER ELECTRONIC DEVICE INCLUDING SAME

CROSS-REFERENCE TO RELATED APPLICATIONS

This application is the National Stage filing under 35 U.S.C. 371 of International Application No. PCT/KR2023/001046, filed on Jan. 20, 2023, which claims the benefit of earlier filing date and right of priority to Korean Application No. 10-2022-0027180, filed on Mar. 3, 2022, the contents of which are all hereby incorporated by reference herein in their entirety.

FIELD

The present disclosure relates to a slot member and a power electronic apparatus including the same, and more particularly, to a slot member having a structure that can be easily drawn into or withdrawn from a housing by being combined with a module-type capacitor, and to a power electronic apparatus including the same.

BACKGROUND

A PLC (Programmable Logic Circuit), a type of power equipment, is a programmable logic control apparatus that is widely used for automatic control of apparatuses and process control that performs discontinuous operations. The PLC is equipped with a PCB for processing control signals and a capacitor for supplying power to the PCB.

An example of a capacitor used to supply power to the miniaturized PLC and various components that are accommodated is the electric double layer capacitor (EDLC). EDLCs store electric energy by utilizing the electric double layer phenomenon and the adsorption and desorption reactions of charges. EDLC is configured to be energizably connected to a PCB, etc., and to transmit stored power to the PCB.

Recently, as the specifications of PLCs have become more advanced, the capacity or the like of electrical devices accommodated in PLCs has increased. Accordingly, the capacity and number of EDLCs for transmitting power to each component of the PLC are also increasing.

In a traditional PLC structure, capacitors such as EDLCs are fixedly connected to a PCB housed inside. That is, in the PLC of the above structure, the capacitor is provided on the PCB in an onboard form.

Due to the above-mentioned coupling structure, in order to perform maintenance, etc. of the EDLC, it is essential to disassemble the PLC and separate the entire PCB and the capacitors connected thereto.

Therefore, since this work can only be performed by specialized personnel, it is difficult to respond quickly when a problem occurs. Moreover, since replacing the capacitor requires replacing the PCB, which does not require maintenance, this can be very costly and reduce customer satisfaction.

In addition, to disconnect both the capacitors and the PCB, the entire PLC must be powered down. This not only reduces the operational reliability of electrical devices energizably connected to and controlled by the PLC, but can also cause a decrease in work efficiency. Korean Patent Laid-Open Publication No. 10-2012-0014521 discloses an image processing board and a display device having the same. Specifically, it discloses an image processing board having a structure in which a card can be easily connected to a card connection terminal using a guide rail, and a display device having the same.

However, the above prior art document only discloses a method for joining a card and a card connection terminal, which are assumed to be joined by an insertion structure. That is, the above prior part document does not present a method for providing a component for storing power, such as a capacitor, separately from the PCB.

Korean Patent Laid-Open Publication No. 10-2020-0048376 discloses a sub-module of a modular multi-level converter. Specifically, it discloses a sub-module of a modular multilevel converter in which capacitors can be detachably coupled to a housing in a hot swap manner.

However, the above prior art document only presents the method of combining a capacitor and a housing at the concept stage. That is, the combination of the capacitor and other components disclosed in the above prior art document relates to an electrical combination method based on a circuit diagram, and the above prior art document does not present a structural solution for detachably connecting a capacitor to a housing.

Korean Patent Laid-Open Publication No. 10-2012-0014521 (2012 Feb. 17)

Korean Patent Laid-Open Publication No. 10-2020-0048376 (2020 May 8)

SUMMARY

The present disclosure is to solve the above problems, and the present disclosure is directed to providing a slot member having a structure in which a capacitor may be modularized and provided, and a power electronic apparatus including the same.

The present disclosure is also directed to providing a slot member having a structure in which a separation process of all components is not required for maintenance of a capacitor, and a power electronic apparatus including the same.

The present disclosure is also directed to providing a slot member having a structure in which coupling and separation of a capacitor may be easily performed, and a power electronic apparatus including the same.

The present disclosure is also directed to providing a slot member having a structure in which an energization state of a capacitor and other components may be easily formed, and a power electronic apparatus including the same.

The present disclosure is also directed to providing a slot member having a structure in which a separate tool or fastening member is not required for coupling and separation of a capacitor, and a power electronic apparatus including the same.

The present disclosure is also directed to providing a power electronic apparatus having a structure in which a coupling state of a capacitor and other components may be stably maintained.

The problems of the present disclosure are not limited to those mentioned above, and other problems not mentioned will be clearly understood by those of ordinary skill in the art from the following description.

According to an aspect of the present disclosure, provided is a slot member, including a slot body on which a capacitor assembly is seated and which supports the capacitor assembly; a gripping portion continuously formed from one end of the slot body; and a capacitor support portion coupled to the slot body and configured to support an edge of the capacitor assembly, wherein the slot body extends in one direction and is inserted into and coupled to an external housing to be withdrawable therefrom, and the gripping portion is disposed to be exposed to the outside of the external housing.

In this case, a slot member may be provided in which the slot body includes a first wall formed at one edge in the extension direction of the slot body and surrounding one edge of the capacitor assembly from the outside; and a second wall formed at the other edge in the extension direction of the slot body, disposed to face the first wall with the seated capacitor assembly therebetween, and surrounding the other edge of the capacitor assembly from the outside.

In addition, a slot member may be provided in which a plurality of said capacitor support portions are provided, any one or more of the plurality of capacitor support portions are formed at one edge in the extension direction of the slot body and configured to support one edge of the capacitor assembly, and another one or more of the plurality of capacitor support portions are formed at the other edge in the extension direction of the slot body and configured to support the other edge of the capacitor assembly.

In this case, a slot member may be provided in which the capacitor support portion includes a support body coupled to the slot body and formed to extend in the thickness direction of the slot body to surround an edge of the capacitor assembly; and a support protrusion protruding from one surface of the surfaces of the support body facing the capacitor assembly and disposed to face the slot body with the capacitor assembly therebetween.

In addition, a slot member may be provided in which the support protrusion has one edge that is chamfered, facing the seated capacitor assembly and the other edge that is chamfered, opposite to the capacitor assembly.

In this case, a slot member may be provided in which the gripping portion is coupled to one end in the extension direction of the slot body, and at the other end in the extension direction of the slot body, a latching protrusion extending from the slot body and supporting one end of the capacitor assembly is provided.

In addition, a slot member may be provided in which the latching protrusion includes a first extension extending from the other end of the slot body along the one direction; a second extension continuous with an end of the first extension, forming a predetermined angle with the first extension part and extending in the thickness direction of the slot body to surround the one end of the capacitor assembly; and a third extension protruding from one surface of the surfaces of the second extension facing the capacitor assembly and disposed to face the first extension with the capacitor assembly therebetween.

In this case, a slot member may be provided in which a capacitor accommodation portion formed is formed through inside the slot body in the thickness direction to accommodate a capacitor of the capacitor assembly.

In addition, according to an aspect of the present disclosure, provided is a power electronic apparatus, including: a housing with an accommodation space formed therein; a PCB assembly accommodated in the accommodation space; a capacitor assembly which is inserted into the accommodation space to be withdrawable therefrom, is coupled to the PCB assembly, and is energized with the PCB assembly to transmit stored power; and a slot member coupled to the capacitor assembly to support the capacitor assembly, inserted into the accommodation space to be withdrawable together with the capacitor assembly, and detachably coupled to the housing.

In this case, a power electronic apparatus may be provided in which the power electronic apparatus includes a guide member coupled to the PCB assembly and extending in one direction to guide the slide movement of the capacitor assembly and the slot member, wherein each of the capacitor assembly and the slot member is formed to extend in the one direction and is moved in the one direction to be inserted into the accommodation space.

In addition, a power electronic apparatus may be provided in which the guide member includes a guide body that extends in the one direction and has a guide hollow therein that penetrates in the one direction to accommodate the capacitor assembly and the slot member; and a coupling protrusion that is continuous with the guide body and is coupled to the PCB assembly.

In this case, a power electronic apparatus may be provided in which the PCB assembly includes a PCB through hole formed through in the thickness direction, and a PCB substrate energized with the capacitor assembly, and the coupling protrusion includes a protrusion extension that penetrates the PCB through hole and extends from the guide body; and a head extension that is continuous with an end of the protrusion extension and is formed to have a diameter larger than that of the cross-section of the PCB through hole.

In addition, a power electronic apparatus may be provided in which the protrusion extension is formed to extend by a length equal to or greater than the thickness of the PCB substrate, and a portion of the protrusion extension is located outside the protrusion extension.

In this case, a power electronic apparatus may be provided in which the guide body includes a first extension formed to extend in the one direction and surround the guide hollow on one side to support the accommodated capacitor assembly and slot member on the other direction; a second extension formed to extend in the one direction, be continuous with the first extension, and surround the guide hollow on the other side to support the accommodated capacitor assembly and slot member on one side in the thickness direction thereof; and a third extension formed to extend in the one direction, be continuous with the first extension, be disposed to face the second extension with the guide hollow interposed therebetween, and surround the guide hollow on another side to support the accommodated capacitor assembly and slot member on the other side in the thickness direction thereof.

In addition, a power electronic apparatus may be provided in which a plurality of said guide members are provided, and the plurality of guide members are disposed to be spaced apart from each other along the other direction forming a predetermined angle with the one direction, and a separation distance between the plurality of guide members is greater than or equal to a length of the capacitor assembly and the slot member in the other direction.

In this case, a power electronic apparatus may be provided in which the slot member includes a gripping portion detachably coupled to the housing, and the housing includes an insertion opening formed open and through which the capacitor assembly and the slot member pass, and which is covered by the gripping portion; and a support frame surrounding the insertion opening and detachably coupled to the gripping portion.

In addition, a power electronic apparatus may be provided in which the gripping portion includes a gripping body that covers the insertion opening and is formed to extend in one direction; a pressing protrusion located adjacent to each end in the extension direction of the gripping body and configured to be movable toward said each end of the gripping body by an external force; and an insertion protrusion coupled to the pressing protrusion, protruding outward in the one direction, moving with the pressing protrusion, and detachably coupled to the support frame, and the pressing protrusion and the insertion protrusion are formed of a material having a predetermined elasticity, and return to the position before movement when the external force is released.

In this case, a power electronic apparatus may be provided in which the pressing protrusion and the insertion protrusion are formed of a polycarbonate acrylo-nitrile-butadiene-styrene (PC-ABS) material.

In addition, a power electronic apparatus may be provided in which the support frame includes an identification protrusion partially surrounding the insertion opening and protruding toward the insertion opening, and the gripping portion includes an identification recessed portion that forms a portion of the outer circumference thereof and is formed to align with the identification protrusion.

In this case, a power electronic apparatus may be provided in which the PCB assembly includes a PCB substrate located in the accommodation space and provided in a plate shape; and a connector coupled to the PCB substrate and energized with the PCB substrate, and a plurality of guide members extending in one direction are disposed to be spaced apart from each other along the other direction on the PCB substrate, the capacitor assembly and the slot member are formed to extend in the one direction, and each edge in the other direction is accommodated in and supported by the plurality of guide members, respectively, the capacitor assembly comprises a capacitor connector positioned at an end in the one direction and detachably coupled to the connector, and when the capacitor assembly and the slot member are accommodated in the accommodation space along the one direction, the capacitor connector is coupled to the connector so that the capacitor assembly and the PCB assembly are energized.

According to the above configuration, a slot member and a power electronic apparatus including the same according to an exemplary embodiment of the present disclosure may be provided by modularizing a capacitor.

The capacitor is provided in the capacitor assembly provided to be detachable from the housing. The capacitor assembly includes a capacitor and a capacitor substrate coupled to and energized with the capacitor. The capacitor substrate is coupled to and energized with the capacitor connector.

The capacitor assembly is seated on the slot member. The slot member is slid and configured to be inserted into or withdrawn from the housing. The slot member includes a slot body in which the capacitor assembly is seated and a capacitor support portion supporting an edge of the seated capacitor assembly at a plurality of positions. The capacitor support portion is formed to partially cover the upper side of the seated capacitor assembly to prevent arbitrary separation of the capacitor assembly.

The capacitor assembly and the slot member may be inserted into or withdrawn from the housing together. A PCB assembly is provided in the space formed inside the housing. As the capacitor assembly and the slot member are inserted into the space formed inside the housing, the capacitor connector may be inserted into and coupled to the connector of the PCB assembly.

Thus, the capacitor may be modularized by the capacitor assembly and detachably coupled to the housing.

In addition, according to the above configuration, the slot member and the power electronic apparatus including the same according to an exemplary embodiment of the present disclosure do not require a separation process of all components for the maintenance of the capacitor.

As described above, the capacitor is provided in the capacitor assembly. The capacitor assembly and the slot member supporting it are withdrawably coupled to the housing. When the capacitor needs to be repaired, the capacitor assembly and the slot member coupled thereto may be withdrawn to perform maintenance on the capacitor.

Therefore, even if the entire power electronic apparatus is not disassembled, maintenance of the capacitor may be performed. Accordingly, other components energized with the capacitor, such as a PCB substrate, can be used as it is without a replacement process, thereby improving user convenience and satisfaction.

In addition, according to the above configuration, in the slot member and the power electronic apparatus including the same according to an exemplary embodiment of the present disclosure, coupling and separation of capacitors may be easily performed.

A guide member is coupled to the PCB assembly. The guide member extends along a direction in which the capacitor assembly and the slot member are drawn into or withdrawn from the housing. A plurality of said guide members are provided and are disposed to be spaced apart from each other along the width direction of the capacitor assembly or the slot member.

A guide hollow formed through in the extension direction of the guide member is formed inside the guide member. The outer side of the guide hollow is surrounded by a plurality of extension portions. The inside of the guide hollow, that is, each side of the plurality of guide members facing each other, is formed to be open and communicates with an insertion space formed between the plurality of guide members.

Each edge of the capacitor assembly and the slot member in the width direction may be guided by the guide member while being inserted into the guide hollow, and can be slid and moved and drawn into or withdrawn from the housing. In this case, the direction of movement of the capacitor assembly and the slot member is limited to the direction of drawn-in or withdrawn from the housing by a plurality of extension portions surrounding the guide hollow.

In this case, the guide member forms a predetermined interval and is coupled to the PCB assembly. In addition, the separation distance between the plurality of guide members is formed to be greater than or equal to the length of the capacitor assembly and the slot member in the width direction.

Therefore, even when a low-skilled operator proceeds with the work, the capacitor assembly and slot member can be easily drawn into and withdrawn from the housing.

In addition, according to the above configuration, in the slot member and the power electronic apparatus including the same according to an exemplary embodiment of the present disclosure, energization state of the capacitor and other components can be easily formed.

A connector is provided in the PCB assembly. The connector is disposed to overlap the insertion space along the direction in which the capacitor assembly and the slot member are drawn or drawn out. In addition, the connector is placed on the same line as the capacitor connector provided in the capacitor assembly.

In an embodiment, the connector and the capacitor connector may be coupled and energized in a form in which the capacitor connector is inserted into the connector. As the drawing-in of the capacitor assembly and the slot member progresses, the capacitor connector may be inserted into and coupled to the connector, thereby allowing the PCB assembly and capacitor assembly to be energized.

In this case, the guide member is arranged to surround the edge of the capacitor assembly and the slot member in the width direction, so that the movement of the capacitor assembly and the slot member in other directions can be prevented.

Therefore, simply by inserting the capacitor assembly and the slot member into the accommodation space of the housing, the capacitor assembly and the PCB assembly can be energized without separate wiring work.

In addition, according to the above configuration, the slot member and the power electronic apparatus including the same according to an exemplary embodiment of the present disclosure do not require a separate tool or fastening member for coupling and separation of the capacitor.

The slot member and the capacitor assembly coupled thereto are coupled to the housing by a gripping portion provided in the slot member. The gripping portion includes an insertion protrusion protruding outward in the width direction. The insertion protrusion is coupled to a pressing protrusion disposed outside the gripping portion to be spaced apart from an end in the width direction of the gripping portion and moved together.

The pressing protrusion is formed of a material having a predetermined elasticity, and may be moved toward an end of the gripping portion by an external force in a direction toward the inside in the width direction. When the application of the external force is released, the pressing protrusion may be restored to the outside in the width direction of the gripping portion by the stored restoring force.

An insertion opening through which the slot member and the capacitor assembly coupled thereto pass is formed to be open in the housing. The insertion opening is surrounded by a support frame. The support frame is formed to have a predetermined thickness. The insertion protrusion and the pressing protrusion are formed to be greater than or equal to the thickness of the support frame.

The insertion protrusion entered into the insertion opening is pressed by the support frame and moved inward in the width direction of the gripping portion. As the drawing-in of the capacitor assembly and the slot member progresses, the insertion protrusion is positioned to pass the inner end of the support frame in the thickness direction.

In the above state, the external force applied to the insertion protrusion is dissipated, and the insertion protrusion is moved to a position before the external force is applied together with the pressing protrusion, that is, to the outer side in the width direction of the gripping portion. Accordingly, the insertion protrusion is located more inside than the inner end of the support frame, so that the gripping portion and the housing are combined. That is, the gripping portion and the housing may be snap-fitted.

After the housing and the slot member are coupled, when an external force toward the inside of the gripping portion in the width direction is applied to the pressing protrusion, the insertion protrusion is also moved toward the inside. Accordingly, the snap-fitting state between the insertion protrusion and the support frame is released. An operator may withdraw the slot member while pressing the pressing protrusion.

In this case, a latching protrusion is provided at the end of the slot member in the extension direction to support the end of the capacitor assembly in the extension direction. That is, the capacitor assembly may be withdrawn from the housing together with the slot member by the latching protrusion.

Therefore, the capacitor assembly and the slot member coupled thereto can be easily coupled to the housing and PCB assembly without a separate tool or fastening member.

In addition, according to the above configuration, in the slot member and the power electronic apparatus including the same according to an exemplary embodiment of the present disclosure, the coupling state of the capacitor and other components can be stably maintained.

As described above, the insertion protrusion is snap-fitted to the support frame. The coupling state of the insertion protrusion and the support frame can be maintained unless additional external force is applied to the pressing protrusion.

The pressing protrusion is accommodated in the gripping space portion formed recessed in the housing. The pressing protrusion is disposed so as not to protrude from the outer surface of the housing, so that a situation in which the pressing protrusion is arbitrarily pressed by an external environment can be prevented. That is, the pressing protrusion can receive only the external force intentionally applied by an operator.

Therefore, the coupling state between the slot member and the capacitor assembly coupled thereto and the housing can be stably maintained. Accordingly, the energization state of the capacitor assembly and the PCB assembly can also be stably maintained.

Advantageous effects of the present disclosure are not limited to the above-described effects, and should be understood to include all effects that can be inferred from the configuration of the disclosure described in the detailed description or claims of the present disclosure.

DETAILED DESCRIPTION

Figure 1:
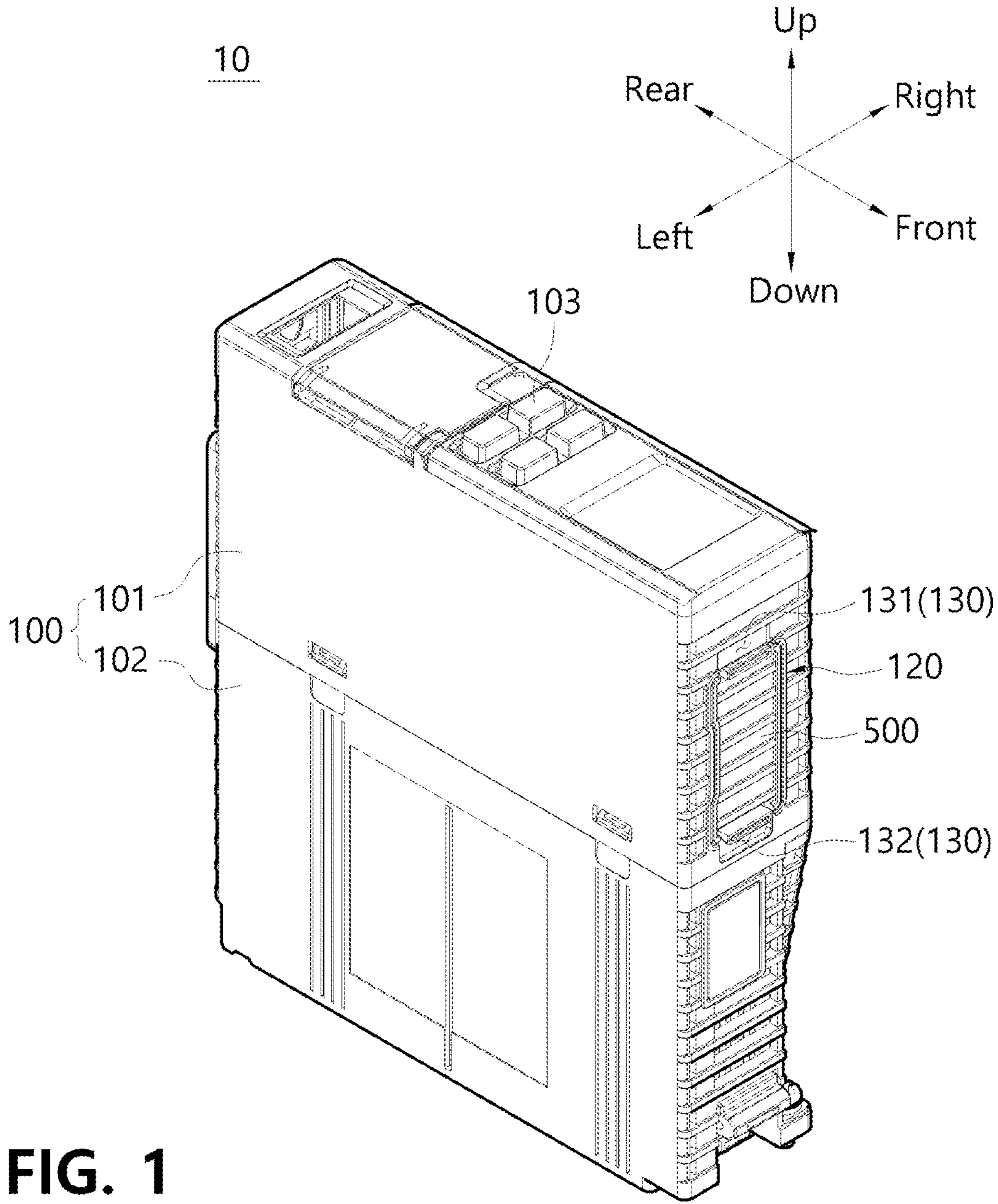
FIG. 1 is a perspective view illustrating a power electronic apparatus according to an exemplary embodiment of the present disclosure.

Hereinafter, exemplary embodiments of the present disclosure will be described in detail so that those of ordinary skill in the art can readily implement the present disclosure with reference to the accompanying drawings. The present disclosure may be embodied in many different forms and is not limited to the embodiments set forth herein. In the drawings, parts unrelated to the description are omitted for clarity of description of the present disclosure, and throughout the specification, same or similar reference numerals denote same elements.

Terms and words used in the present specification and claims should not be construed as limited to their usual or dictionary definition. They should be interpreted as meaning and concepts consistent with the technical idea of the present disclosure, based on the principle that inventors may appropriately define the terms and concepts to describe their disclosure in the best way.

Accordingly, the embodiments described in the present specification and the configurations shown in the drawings correspond to preferred embodiments of the present disclosure, and do not represent all the technical idea of the present disclosure, so the configurations may have various examples of equivalent and modification that can replace them at the time of filing the present disclosure.

In the following description, in order to clarify the features of the present disclosure, descriptions of some components may be omitted.

1. Term Definition

The term "communication" used in the following description means that one or more members are connected to each other so as to be in fluid communication. In an embodiment, communication may be formed by a member such as a conduit, a pipe, a tubing, or the like.

The term "energization" used in the following description means that one or more members are connected to each other so as to transmit an electric current or an electric signal. In an embodiment, the energization may be formed in a wired form by a wire member or the like or in a wireless form such as Bluetooth, Wi-Fi, RFID, or the like.

The terms "above or upper side", "below or lower side", "left side", "right side", "front side", and "rear side" used in the following description will be understood with reference to the coordinate system shown in the accompanying drawings.

Figure 2:
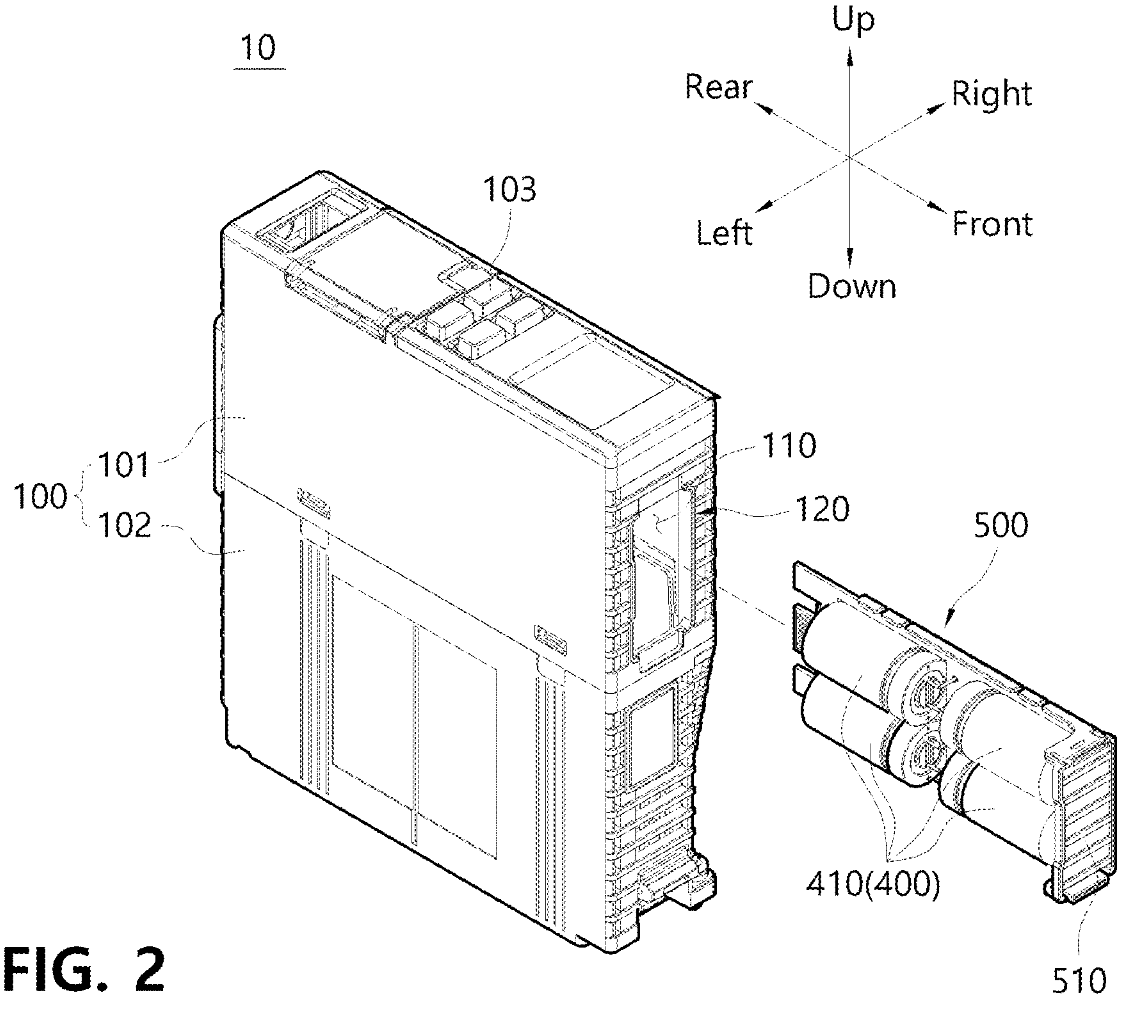
FIG. 2 is an exploded perspective view illustrating a capacitor assembly provided in the power electronic apparatus of FIG. 1.
Figure 3:
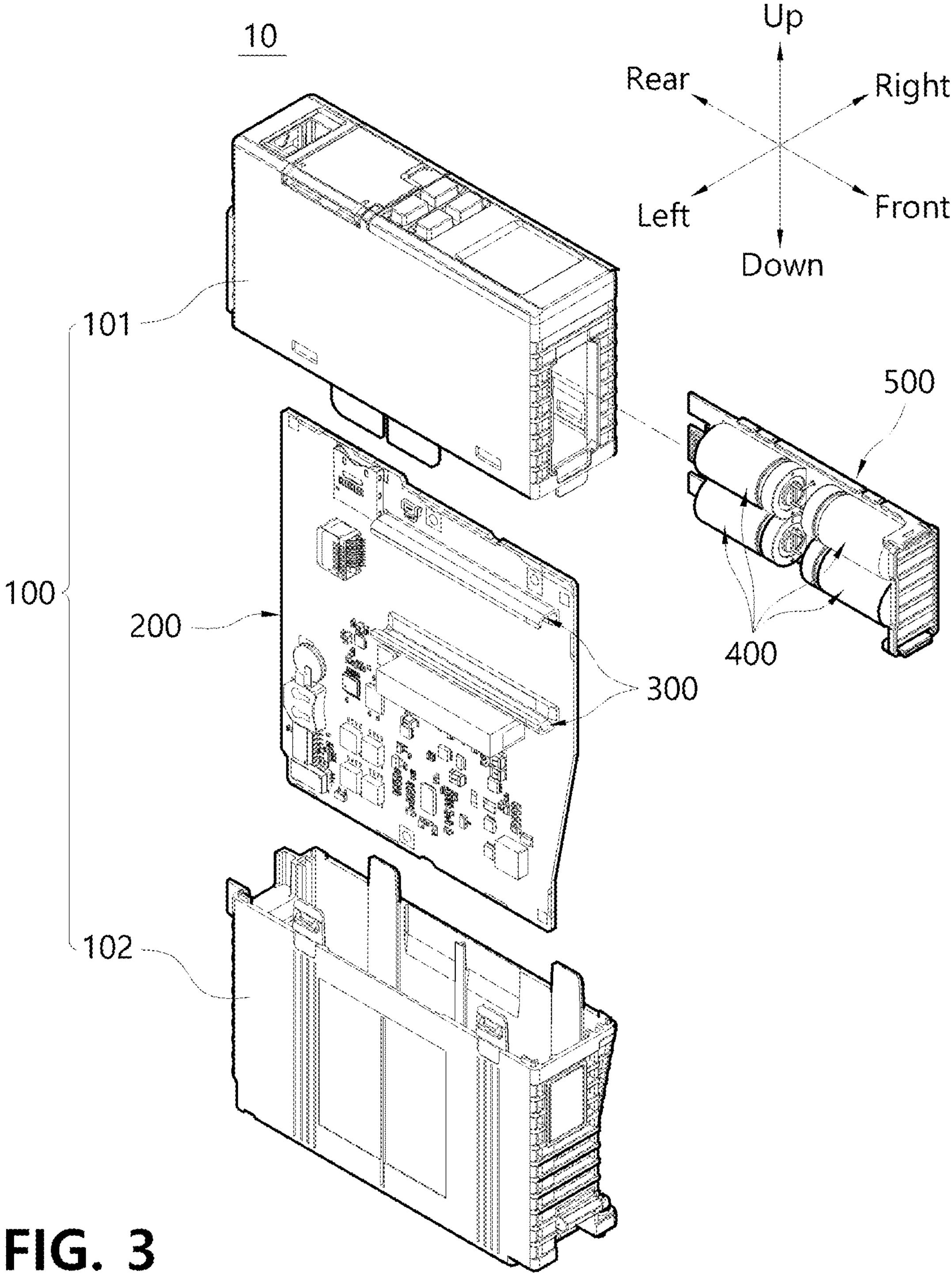
FIG. 3 is an exploded perspective view illustrating a PCB assembly and a capacitor assembly provided in the power electronic apparatus of FIG. 1.

2. Description of the Configuration of the Power Electronic Apparatus 10 According to an Exemplary Embodiment of the Present Disclosure Referring to FIGS. 1 to 3, a power electronic apparatus 10 according to an exemplary embodiment of the present disclosure is shown.

The power electronic apparatus 10 may be provided in any form capable of performing a preset function by accommodating various electric and electronic apparatuses therein. In an embodiment, the power electronic apparatus 10 may be provided as a programmable logic controller (PLC) and be configured to control or monitor operations of other electrical apparatuses that are energized. In the above embodiment, the power electronic apparatus 10 may be energizably connected to an external other apparatus.

A plurality of power electronic apparatuses 10 may be provided. The plurality of power electronic apparatuses 10 may be energizably connected to each other. In the above embodiment, the number of power electronic apparatuses 10 energizably connected to each other may be adjusted so that the capacity of the entire electrical equipment configured by the power electronic apparatus 10 may be adjusted.

The power electronic apparatus 10 according to an exemplary embodiment of the present disclosure includes a plurality of capacitors 410 provided therein and functioning as power. In this case, each capacitor 410 includes a plurality of modular capacitor assemblies 400. The number of capacitor assemblies 400 provided may be changed according to an operation situation of the power electronic apparatus 10.

In addition, in the power electronic apparatus 10 according to an exemplary embodiment of the present disclosure, only a specific capacitor assembly 400 that requires maintenance among a plurality of capacitor assemblies 400 may be separated. In this case, the other capacitor assemblies 400 of the power electronic apparatus 10 may be configured to still operate.

The capacitor assembly 400 may be coupled to the power electronic apparatus 10 or separated from the power electronic apparatus 10 without a separate tool. In addition, the capacitor assembly 400 may be maintained in a state of being coupled to the power electronic apparatus 10 without a separate fastening member.

Furthermore, the capacitor assembly 400 may be coupled to the power electronic apparatus 10 or separated from the power electronic apparatus 10 even when the inside of the power electronic apparatus 10 is not completely open.

The power electronic apparatus 10 may be operated by power transmitted from the capacitor assembly 400. In addition, the power electronic apparatus 10 is equipped with a separate auxiliary power (not shown) and may be operated by power transmitted by the auxiliary power (not shown) in case of emergency.

Therefore, even when maintenance of the capacitor assembly 400 is required, the power electronic apparatus 10 may be operated for a predetermined time without being powered off.

Hereinafter, a configuration of the power electronic apparatus 10 according to an exemplary embodiment of the present disclosure will be described in detail with reference to the accompanying drawings.

In the illustrated embodiment, the power electronic apparatus 10 includes a housing 100, a PCB assembly 200, a guide member 300, a capacitor assembly 400, and a slot member 500.

The housing 100 forms the outer shape of the power electronic apparatus 10. A space is formed inside the housing 100 so that other components of the power electronic apparatus 10 may be accommodated. In the illustrated embodiment, the PCB assembly 200, the guide member 300, the capacitor assembly 400, and the slot member 500 are accommodated in the housing 100.

The housing 100 may be formed of a material having high rigidity and electrical insulation and thermal insulation. This is to prevent damage due to external impact, heat, etc., and to prevent arbitrary energization of the outside with other components accommodated inside the housing 100.

The housing 100 may be formed of a lightweight material. In the above embodiment, the power electronic apparatus 10 may be easily moved.

In an embodiment, the housing 100 may be formed of a synthetic resin material such as polycarbonate.

The inside of the housing 100 communicates with the outside. The PCB assembly 200, the capacitor assembly 400, and the like accommodated in the housing 100 may be cooled by a fluid introduced into the housing 100, for example, air.

The inside of the housing 100 is energized with the outside. The PCB assembly 200, the capacitor assembly 400, and the like accommodated in the housing 100 may be energized with an external electrical apparatus.

The housing 100 may be provided in any form capable of accommodating components of the power electronic apparatus 10 therein and preventing arbitrary exposure of the accommodated components. In the illustrated embodiment, the housing 100 has a quadrangular pillar shape in which the extension length in the front-rear direction is longer than the extension length in the left-right direction, with a height in the up-down direction.

A plurality of ribs may be formed on an outer surface of the housing 100, that is, a front side surface in the illustrated embodiment. The plurality of ribs may be configured to reinforce the rigidity of the housing 100. In addition, the capacitor assembly 400, which will be described later, is drawn in and out through the front side surface above, and the plurality of ribs can be said to help an operator to recognize the drawing-in direction of the capacitor assembly 400.

Figure 24:
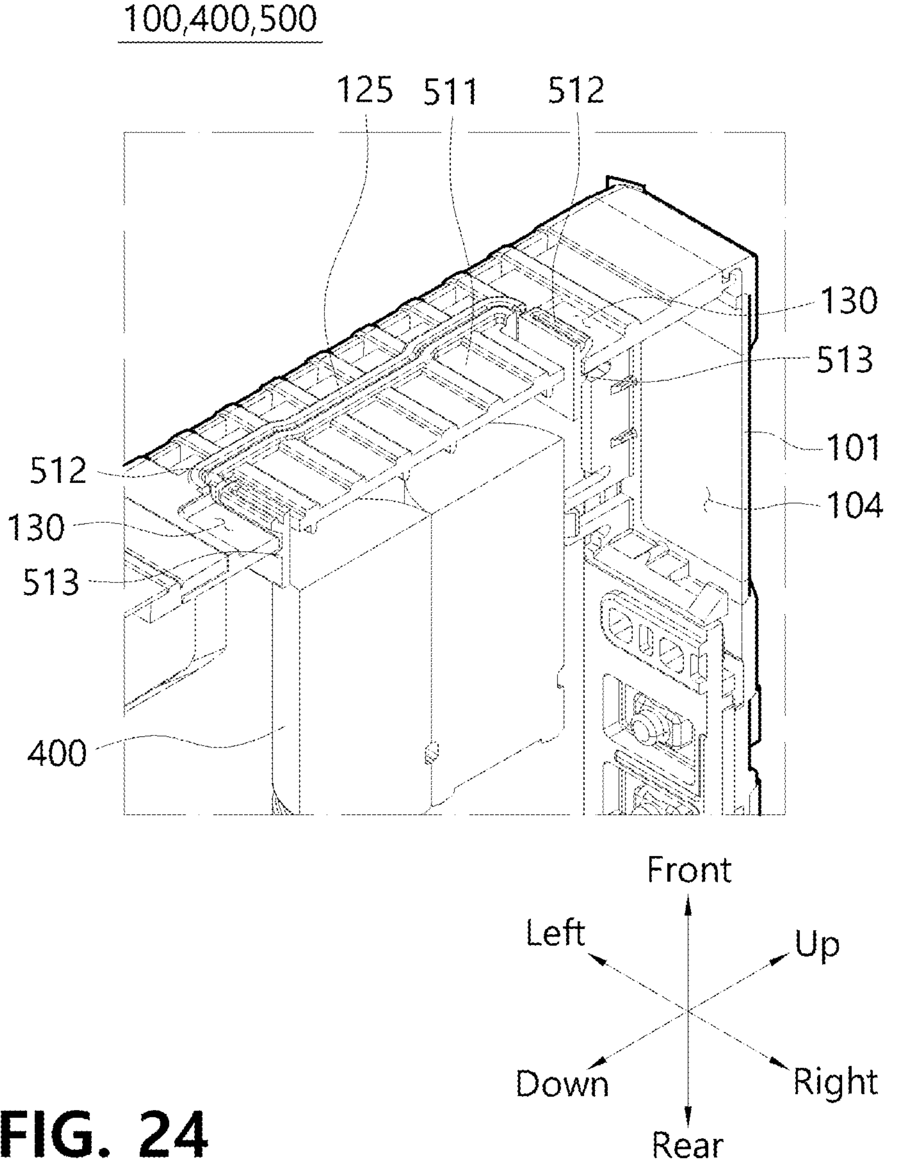
FIG. 24 is a partially open perspective view illustrating a coupled state of the capacitor assembly of FIG. 3 and the housing of FIG. 4.

In the illustrated embodiment, the housing 100 is configured to include an upper housing 101, a lower housing 102, an operation button 103, and an accommodation space 104 (see FIG. 24).

The housing 100 may be divided into a plurality of portions. In the illustrated embodiment, the housing 100 includes an upper housing 101 located at the upper side and a lower housing 102 located at the lower side and coupled to the upper housing 101.

The upper housing 101 and the lower housing 102 may be detachably coupled to each other. In an embodiment, the upper housing 101 and the lower housing 102 may be hook-fitted and easily coupled. In the above embodiment, the coupled upper housing 101 and lower housing 102 are not arbitrarily separated unless an external force of a specific direction and a predetermined size or more is applied.

Space is formed inside the upper housing 101 and the lower housing 102, respectively. Other components of the power electronic apparatus 10 are accommodated in the space. The space formed inside the upper housing 101 and the space formed inside the lower housing 102 communicate with each other and are defined as an accommodation space 104.

A plurality of operation buttons 103 are provided on one side of the upper housing 101, that is, on the upper side in the illustrated embodiment. The operation button 103 may be pressed and operated by an operator to receive a control signal for controlling the operation of the power electronic apparatus 10. Alternatively, the operation button 103 may be provided in the form of a touch screen or a dial or the like.

The accommodation space 104 is a space formed inside the housing 100. The accommodation space 104 accommodates other components of the power electronic apparatus 10, i.e., the PCB assembly 200, the guide member 300, the capacitor assembly 400, and the slot member 500. The accommodation space 104 is surrounded by each surface of the housing 100 and is not arbitrarily exposed to the outside.

The accommodation space 104 may communicate with the outside and may be energized. Accordingly, a fluid for cooling the PCB assembly 200 and the capacitor assembly 400 accommodated in the accommodation space 104 may be introduced. In addition, the PCB assembly 200 and the capacitor assembly 400 accommodated in the accommodation space 104 may be energized with external electrical apparatuses.

Figure 4:
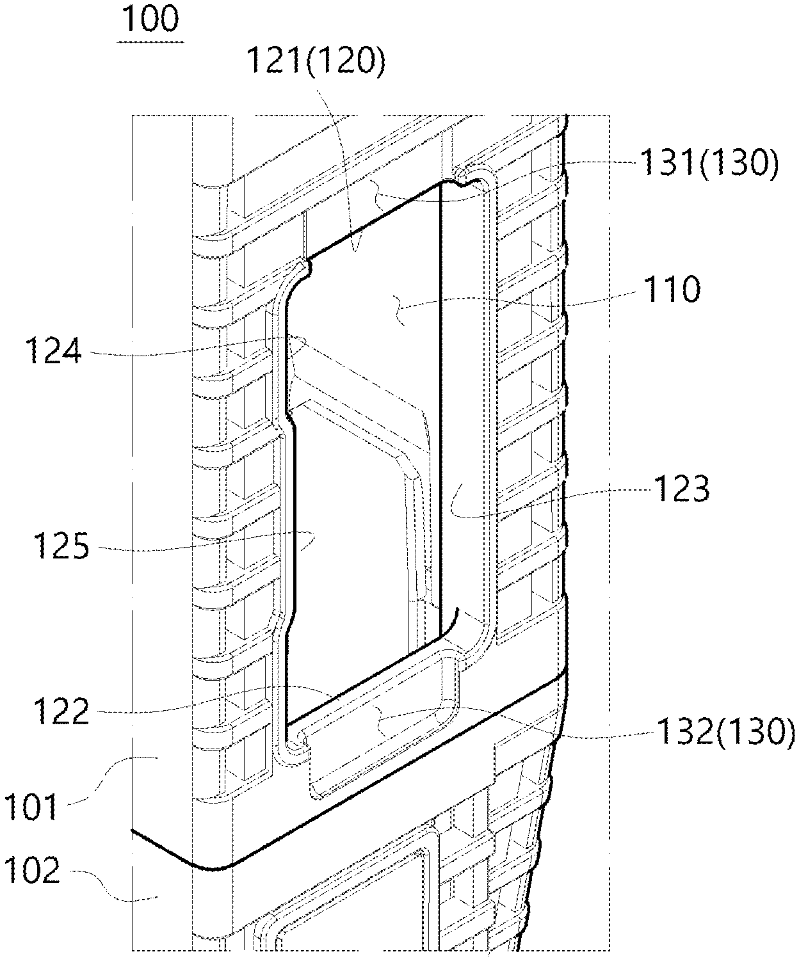
FIG. 4 is a perspective view illustrating a housing of the power electronic apparatus of FIG. 1.
Figure 5:
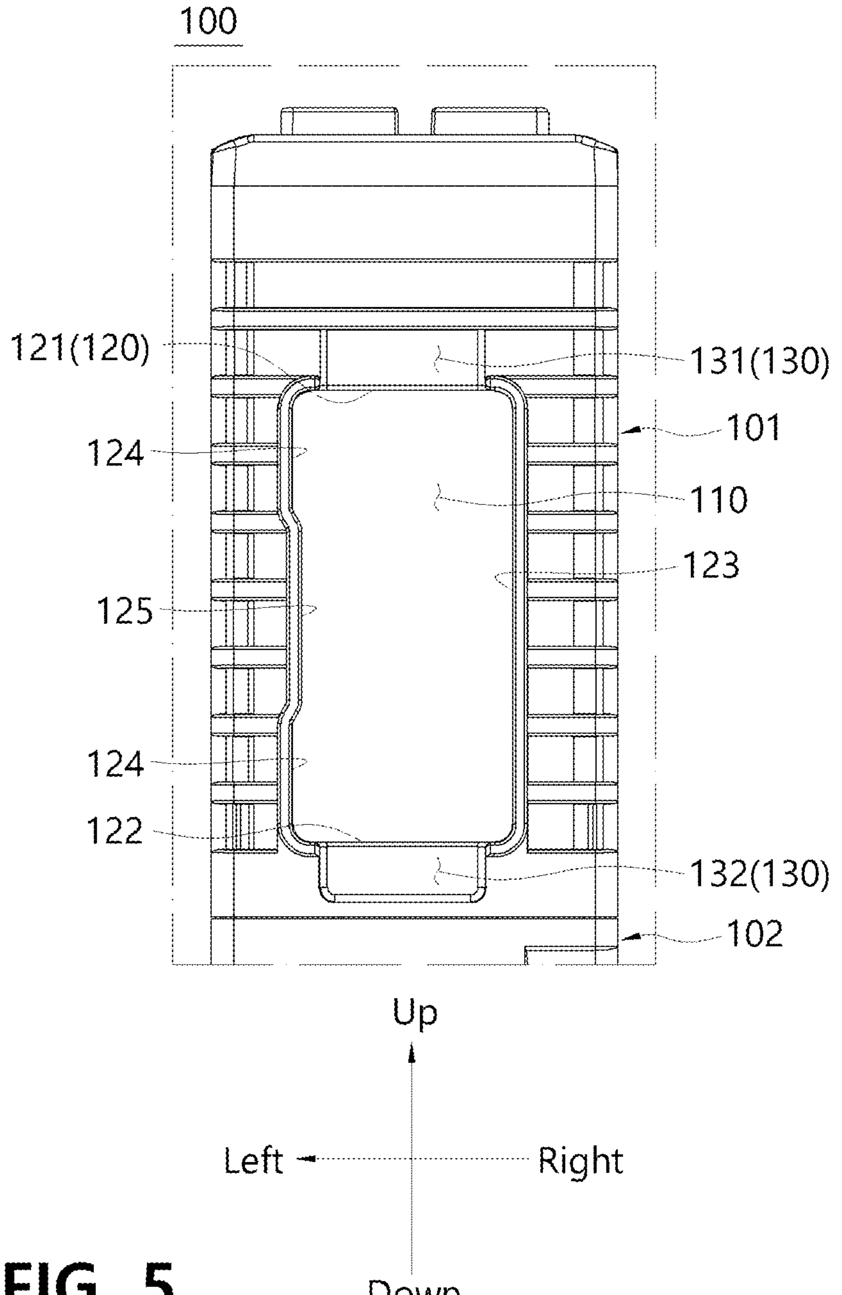
FIG. 5 is a front view illustrating the housing of FIG. 4.

Referring further to FIGS. 4 and 5, the housing 100, specifically, the upper housing 101, is provided with an insertion opening 110, a support frame 120, and a gripping space portion 130.

The insertion opening 110 communicates the accommodation space 104 with the outside. The insertion opening 110 is formed through one surface of the surfaces of the housing 100 in the thickness direction. In the illustrated embodiment, the insertion opening 110 is formed through the front side surface of the upper housing 101.

The capacitor assembly 400 and the slot member 500 coupled thereto may pass through the insertion opening 110. The capacitor assembly 400 and the slot member 500 coupled thereto may be drawn into the accommodation space 104 or withdrawn from the accommodation space 104 through the insertion opening 110.

The insertion opening 110 may have an arbitrary shape through which the capacitor assembly 400 and the slot member 500 may pass. In the illustrated embodiment, the insertion opening 110 is formed to have a quadrangular cross-section in which a length in the left-right direction is longer than a length in the up-down direction.

An inner circumferential portion of the housing 100 surrounding the insertion opening 110 may be defined as a support frame 120.

The support frame 120 surrounds the insertion opening 110 from the outside. In other words, the support frame 120 may be referred to as a boundary of the insertion opening 110.

When the slot member 500 is drawn into the housing 100, the support frame 120 may be disposed to surround the gripping portion 510. That is, the support frame 120 supports the gripping portion 510 of the slot member 500 from the outside.

In addition, the inside of the support frame 120, that is, the part facing the accommodation space 104 may be snap-fitted with an insertion protrusion 513 of the slot member 500. In the illustrated embodiment, the rear side portion of the support frame 120 may be coupled to the insertion protrusion 513.

The support frame 120 may include a plurality of portions. That is, as described above, the insertion opening 110 is formed to have a polygonal cross-section, and the support frame 120 may be divided into a plurality of edges surrounding the insertion opening 110.

In the illustrated embodiment, the support frame 120 includes a first portion 121, a second portion 122, a third portion 123, a fourth portion 124, and an identification protrusion 125.

The first portion 121 forms a portion of the support frame 120. The first portion 121 surrounds the insertion opening 110 on one side, that is, on the upper side in the illustrated embodiment. Accordingly, it may be said that the first portion 121 may form the upper side of the support frame 120.

One edge of the edges of the first portion 121 toward the accommodation space 104, that is, the rear edge in the illustrated embodiment, may be snap-fitted to the insertion protrusion 513 to be described later. A first gripping space portion 131 is formed on one side of the first portion 121 opposite to the insertion opening 110, that is, on the upper side in the illustrated embodiment.

The first portion 121 extends in the width direction of the insertion opening 110, that is, in the left-right direction in the illustrated embodiment. The first portion 121 is continuous with the third portion 123 and the fourth portion 124. The first portion 121 is disposed to face the second portion 122 with the insertion opening 110 interposed therebetween.

The second portion 122 forms another portion of the support frame 120. The second portion 122 surrounds the insertion opening 110 on another side, that is, on the lower side in the illustrated embodiment. Accordingly, it may be said that the second portion 122 may form the lower side of the support frame 120.

One edge of the edges of the second portion 122 toward the accommodation space 104, that is, the rear edge in the illustrated embodiment, may be snap-fitted to the insertion protrusion 513 to be described later. A second gripping space portion 132 is formed on one side of the second portion 122 opposite to the insertion opening 110, that is, on the lower side in the illustrated embodiment.

The second portion 122 extends in the width direction of the insertion opening 110, that is, in the left-right direction in the illustrated embodiment. The second portion 122 is continuous with the third portion 123 and the fourth portion 124. The second portion 122 is disposed to face the first portion 121 with the insertion opening 110 interposed therebetween.

The third portion 123 forms yet another portion of the support frame 120. The third portion 123 surrounds the insertion opening 110 on yet another side, that is, on the right side in the illustrated embodiment. Accordingly, it may be said that the third portion 123 may form the right side of the support frame 120.

The third portion 123 extends in the height direction of the insertion opening 110, that is, in the up-down direction in the illustrated embodiment. The third portion 123 is continuous with the first portion 121 and the second portion 122. The third portion 123 is disposed to face the fourth portion 124 and the identification protrusion 125 with the insertion opening 110 interposed therebetween.

Meanwhile, the third portion 123 may be formed to have a shape different from that of the fourth portion 124 and the identification protrusion 125. That is, in the illustrated embodiment, the third portion is formed to extend in a straight line along the up-down direction. On the other hand, the fourth portion 124 extends in a straight line along the up-down direction, and the identification protrusion 125 protrudes toward the insertion opening 110.

Therefore, one side where the third portion 123 is located (i.e., right side in the illustrated embodiment) and the other side where the fourth portion 124 and the identification protrusion 125 are located (i.e., left side in the illustrated embodiment) may be easily identified outside the housing 100.

Accordingly, the insertion direction of the capacitor assembly 400 and the slot member 500 to be described later may be easily recognized. This will be described later in detail.

The fourth portion 124 forms still yet another portion of the support frame 120. The fourth portion 124 partially surrounds the insertion opening 110 on still yet another side, that is, on the left side in the illustrated embodiment. Accordingly, it may be said that the fourth portion 124 may form a part of the left side of the support frame 120.

The fourth portion 124 may include a plurality of portions. In the illustrated embodiment, the fourth portion 124 is formed on the upper side and the lower side of the identification protrusion 125, respectively. In other words, the fourth portion 124 is provided as a pair disposed facing each other with the identification protrusion 125 interposed therebetween.

The fourth portion 124 extends in the height direction of the insertion opening 110, that is, in the up-down direction in the illustrated embodiment. One portion positioned at the upper side of the pair of fourth portions 124 is continuous with the first portion 121 and the identification protrusion 125. The other portion positioned at the lower side of the pair of fourth portions 124 is continuous with the second portion 122 and the identification protrusion 125.

The fourth portion 124 is disposed to face the third portion 123 with the insertion opening 110 interposed therebetween.

The identification protrusion 125 forms the remaining portion of the support frame 120. The identification protrusion 125 partially surrounds the insertion opening 110 on the still yet another side, that is, on the left side in the illustrated embodiment. Accordingly, it may be said that the identification protrusion 125 may form the remaining part of the left side of the support frame 120.

The identification protrusion 125 is formed to protrude by a predetermined length toward the insertion opening 110. By the identification protrusion 125, the left portions and the right portions of the support frame 120 and the insertion opening 110 surrounded thereby have different shapes. Accordingly, the insertion direction of the capacitor assembly 400 and the slot member 500 may be easily identified as described above.

The identification protrusion 125 is located between a plurality of fourth portions 124. In the illustrated embodiment, the identification protrusion 125 is located between a pair of fourth portions 124 along the up-down direction thereof.

The identification protrusion 125 extends in the height direction of the insertion opening 110, that is, in the up-down direction in the illustrated embodiment. The identification protrusion 125 is continuous with the pair of fourth portions 124, respectively.

The identification protrusion 125 protrudes in the width direction of the insertion opening 110, that is, in the left-right direction in the illustrated embodiment. The protruding length of the identification protrusion 125 does not interfere with the drawing-in and withdrawal of the capacitor assembly 400, but is preferably formed long enough to be identified by an operator with the naked eye or touch.

The identification protrusion 125 may be formed on an arbitrary portion of the support frame 120 surrounding the insertion opening 110 in the outer circumferential direction. In the illustrated embodiment, the identification protrusion 125 is disposed to face the third portion 123 with the insertion opening 110 interposed therebetween.

Alternatively, the identification protrusion 125 may be formed on any one or more of the first portion 121, the second portion 122, the third portion 123, and the fourth portion 124. In any case, it is sufficient if an operator can easily recognize the direction in which the capacitor assembly 400 and the slot member 500 coupled thereto are inserted into the housing 100. In this case, the identification protrusion 125 may be continuous with any one or more portions.

The gripping space portion 130 accommodates a pressing protrusion 512 of the slot member 500. An operator may insert a finger into the gripping space portion 130 and press the pressing protrusion 512. By the pressing, the slot member 500 and the capacitor assembly 400 coupled thereto may be withdrawn from the housing 100.

In addition, the gripping space portion 130 accommodates the pressing protrusion 512 so that the pressing protrusion 512 does not protrude to the outside of the housing 100. In other words, the gripping space portion 130 compensates for the thickness of the pressing protrusion 512 and adjusts such that the outer surface of the slot member 500 and the outer surface of the housing 100 are located on the same plane.

The gripping space portion 130 is formed by being recessed in the outer surface of the housing 100. In the illustrated embodiment, the gripping space portion 130 is formed by being recessed on the front side surface of the upper housing 101. It is preferable that the recessed length of the gripping space portion 130 is greater than or equal to the thickness of the pressing protrusion 512.

The gripping space portion 130 is positioned adjacent to the insertion opening 110. The gripping space portion 130 communicates with the insertion opening 110. Accordingly, a portion of the slot member 500 may be accommodated in the insertion opening 110, and the pressing protrusion 512 may be accommodated in the gripping space portion 130.

The gripping space portion 130 is positioned adjacent to a plurality of portions of the support frame 120. In the illustrated embodiment, the gripping space portion 130 is positioned adjacent to the first portion 121 and the second portion 122, respectively.

The gripping space portion 130 may have any shape capable of communicating with the insertion opening 110 and accommodating the pressing protrusion 512. In the illustrated embodiment, the gripping space portion 130 is formed to have a quadrangular cross-section in which the extension length in the width direction thereof, that is, in the left-right direction in the illustrated embodiment, is longer than the extension length in the height direction thereof, that is, in the up-down direction in the illustrated embodiment.

In this case, the length of the gripping space portion 130 in the width direction is preferably formed to be greater than or equal to the height of the pressing protrusion 512. In addition, the length of the gripping space portion 130 in the height direction is formed to be more than or equal to the width of the pressing protrusion 512, but is preferably formed long enough to allow an operator's finger to be inserted.

A plurality of gripping space portions 130 may be formed. The plurality of gripping space portions 130 may be spaced apart from each other to accommodate the pressing protrusion 512 at different positions, respectively. In the illustrated embodiment, a pair of gripping space portions 130 are provided, including a first gripping space portion 131 positioned on the upper side and a second gripping space portion 132 positioned on the lower side.

The first gripping space portion 131 is positioned adjacent to one side in the extension direction of the insertion opening 110, that is, to the upper side in the illustrated embodiment. The first gripping space portion 131 communicates with the one end, that is, the upper end of the insertion opening 110.

The second gripping space portion 132 is positioned adjacent to the other side in the extension direction of the insertion opening 110, that is, to the lower side in the illustrated embodiment. The second gripping space portion 132 communicates with the other end, that is, the lower end of the insertion opening 110.

The first gripping space portion 131 and the second gripping space portion 132 are spaced apart from each other along the extension direction of the insertion opening 110, that is, the up-down direction in the illustrated embodiment, and are disposed to face the insertion opening 110.

Referring back to FIG. 3, the power electronic apparatus 10 according to the illustrated embodiment includes a PCB assembly 200.

The PCB assembly 200 is energized with an external electric apparatus to substantially perform the role of the power electronic apparatus 10. The PCB assembly 200 may be energized with the capacitor assembly 400 to receive power required for operation.

The PCB assembly 200 is mounted inside the housing 100. In the illustrated embodiment, the PCB assembly 200 is accommodated in an accommodation space 104 formed by communicating the inner spaces of the upper housing 101 and the lower housing 102. The PCB assembly 200 is not arbitrarily exposed to the outside.

The guide member 300 is coupled to the PCB assembly 200. The capacitor assembly 400 and the slot member 500 coupled thereto are guided by the guide member 300 and may be coupled or removed from the PCB assembly 200. The coupling or removal may be achieved by drawing-in or withdrawing the capacitor assembly 400 and the slot member 500 coupled thereto into or from the housing 100.

The PCB assembly 200 is energized with the capacitor assembly 400. The PCB assembly 200 and the capacitor assembly 400 may be detachably coupled to each other. Power required to operate the PCB assembly 200 may be transferred from a capacitor 410 provided in the capacitor assembly 400.

In particular, in the PCB assembly 200 according to an exemplary embodiment of the present disclosure, the capacitor 410 for providing power is not provided integrally with the PCB assembly 200, that is, in the form of an onboard. That is, the PCB assembly 200 and the capacitor 410 may be detachably coupled to each other.

Accordingly, when maintenance of the capacitor 410 or the capacitor assembly 400 including the same is required, only the capacitor assembly 400 may be removed to perform the necessary work.

Referring to FIGS. 6 to 9, in the illustrated embodiments, the PCB assembly 200 includes a PCB substrate 210 and a connector 220.

The PCB substrate 210 is energized with an external electric apparatus to perform a function of the power electronic apparatus 10. The PCB substrate 210 includes various electrical elements energized with each other and may be operated according to a control signal.

The PCB substrate 210 forms a body of the PCB assembly 200. In the illustrated embodiment, the PCB substrate 210 is provided in a plate shape having a horizontal cross-section and a thickness in the up-down direction. In an embodiment, the PCB substrate 210 may be provided in a quadrangular plate shape. In this case, the size of the PCB substrate 210 is preferably smaller than the accommodation space 104 formed inside the housing 100.

Figure 6:
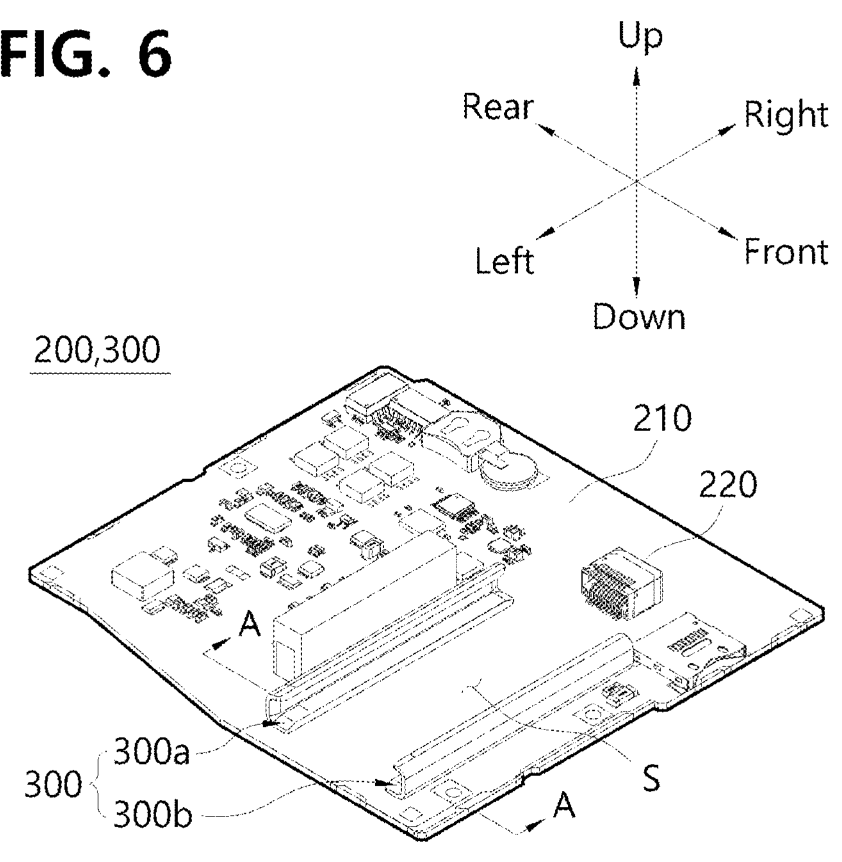
FIG. 6 is a perspective view illustrating the PCB assembly of FIG. 3.
Figure 7:
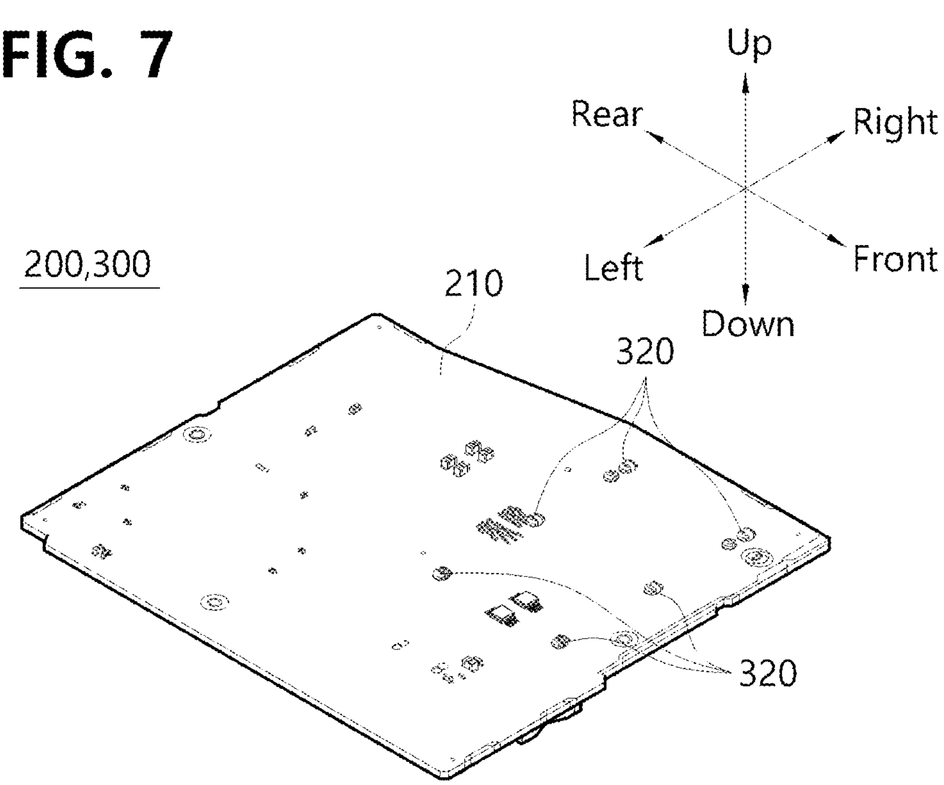
FIG. 7 is a perspective view from another angle, illustrating the PCB assembly of FIG. 3.
Figure 8:
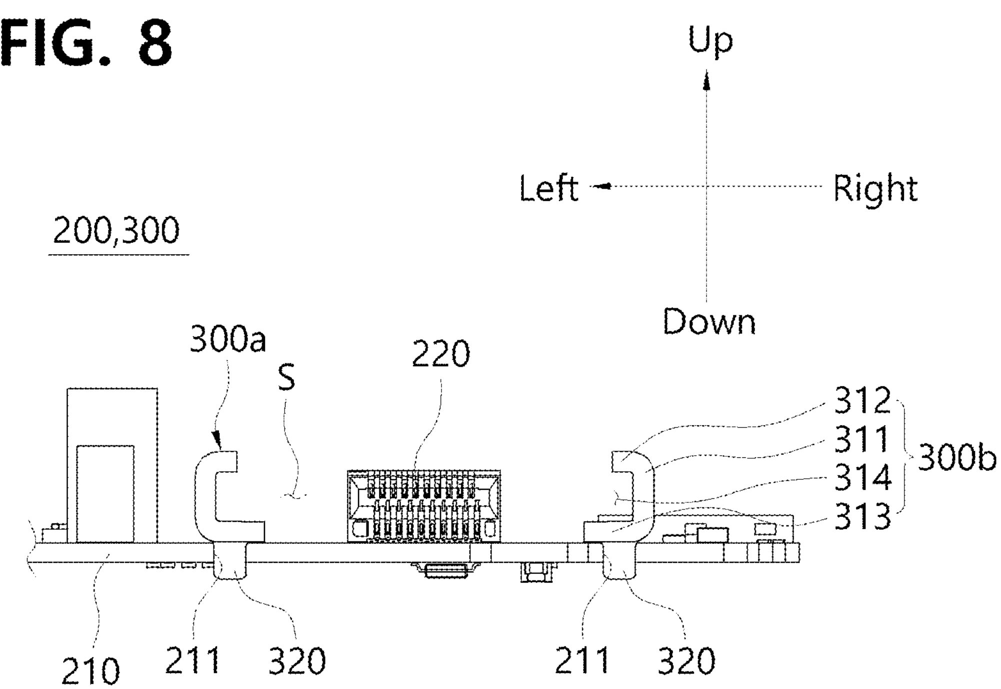
FIG. 8 is an exploded perspective view illustrating the PCB assembly of FIG. 3 and a guide member provided therein.
Figure 9:
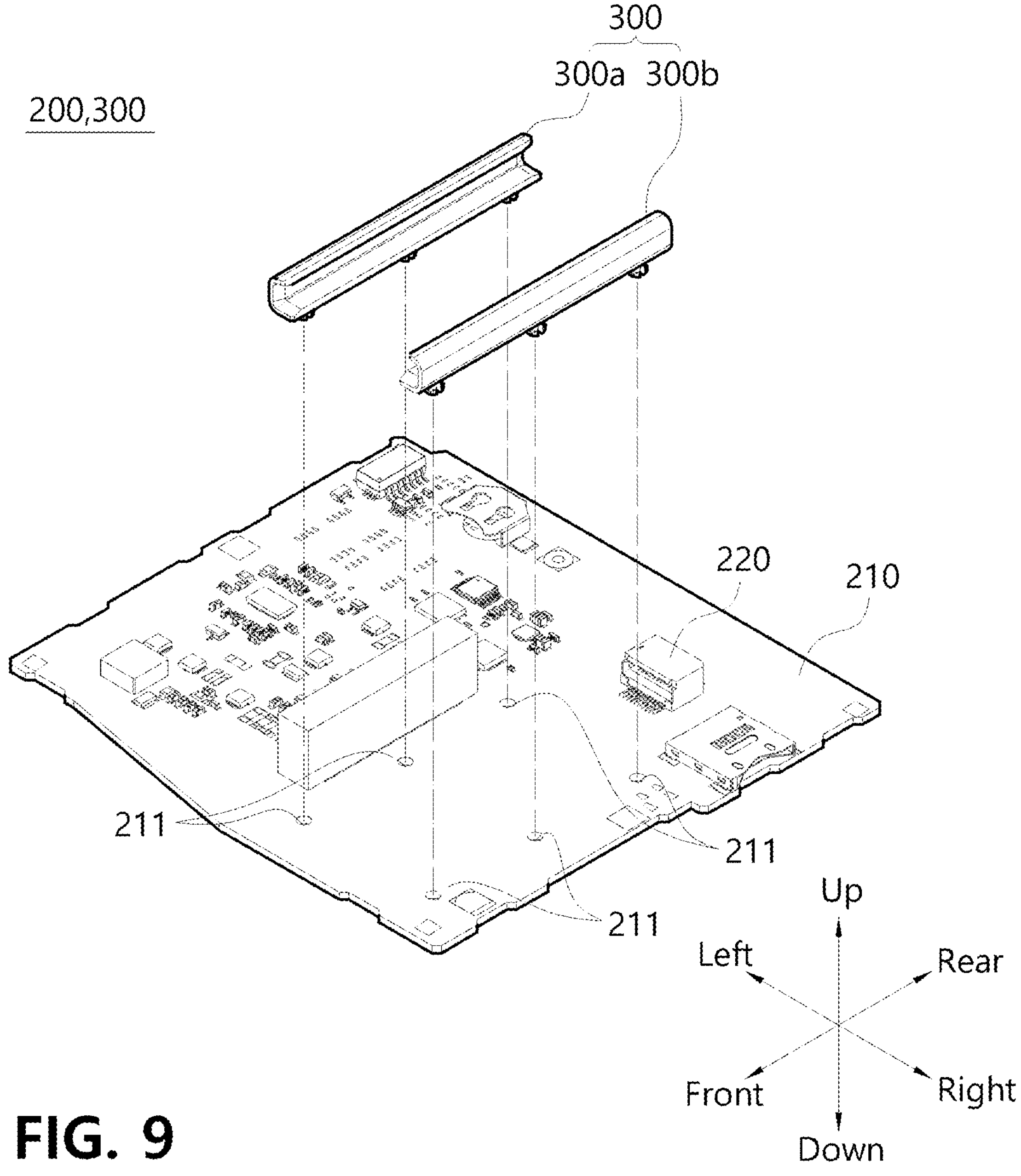
FIG. 9 is an A-A cross-sectional view illustrating the PCB assembly of FIG. 3.

One side of the PCB substrate 210, that is, the rear right side in the embodiment illustrated in FIG. 6, communicates with the outside by the insertion opening 110. A connector 220 may be provided on one side of the PCB substrate 210 to detachably couple the capacitor assembly 400.

Since the operating principle of the PCB substrate 210 is a well-known technology, a detailed description thereof will be omitted.

In the illustrated embodiment, the PCB substrate 210 includes a PCB through hole 211.

The PCB through hole 211 is a portion where the guide member 300 is coupled to the PCB substrate 210. The PCB through hole 211 is formed through the PCB substrate 210 in the thickness direction, that is, in the up-down direction in the illustrated embodiment.

A plurality of PCB through holes 211 may be formed. The plurality of PCB through holes 211 may be spaced apart from each other and formed at various positions. In the embodiments illustrated in FIGS. 7 and 9, a total of six PCB through holes 211 are formed, three on the left and three on the right.

In this case, the three PCB through holes 211 formed on the left are spaced apart by a predetermined distance in the front-rear direction and arranged side by side. Likewise, the three PCB through holes 211 formed on the right are also spaced apart by a predetermined distance in the front-rear direction and arranged side by side.

The plurality of PCB through holes 211 formed on the left and the plurality of PCB through holes 211 formed on the right are spaced apart from each other in the width direction of the PCB substrate 210, that is, in the left-right direction in the illustrated embodiment and are disposed to face each other. A space formed between the plurality of PCB through holes 211 formed on the left and the plurality of PCB through holes 211 formed on the right may be defined as an insertion space S.

That is, the plurality of PCB through holes 211 formed on the left and the plurality of PCB through holes 211 formed on the right are disposed to face each other with the insertion space S interposed therebetween.

The number and arrangement method of the PCB through holes 211 may be changed according to the number and arrangement method of the coupling protrusions 320 provided in the guide member 300.

However, it is preferable that at least two PCB through holes 211 are formed on the left and right, respectively. This is because when a single PCB through hole 211 is formed, there is a risk that the guide member 300 coupled to the single PCB through hole 211 is arbitrarily rotated.

The PCB through hole 211 may have an arbitrary shape to which the coupling protrusion 320 of the guide member 300 may be through-coupled. In the illustrated embodiment, the PCB through hole 211 is formed as a cylindrical space having a circular cross-section in the horizontal direction and extending in the up-down direction.

The connector 220 is a part to which the capacitor assembly 400 is coupled. The PCB assembly 200 may be energized with the capacitor assembly 400 by the connector 220 to receive power.

The connector 220 is coupled to the PCB substrate 210. The connector 220 may be energized with the PCB substrate 210 so that the power received from the capacitor assembly 400 may be transferred to the PCB substrate 210.

In the illustrated embodiment, the connector 220 is located to be biased to the rear right side of the PCB substrate 210. The position of the connector 220 may be changed according to the shape or position of the insertion opening 110 and the capacitor assembly 400 drawn-in and withdrawn-from the insertion opening 110.

The connector 220 is coupled to a capacitor connector 430 of the capacitor assembly 400. The connector 220 may be energized with the capacitor connector 430 to receive the power stored in the capacitor 410.

In an embodiment, a space is formed inside the connector 220 to be coupled to the capacitor connector 430 in a form in which the capacitor connector 430 is drawn-in. In the above embodiment, a separate member or operation for fastening the connector 220 and the capacitor connector 430 is not required, and thus work convenience and efficiency may be improved.

The PCB through hole 211 is located on the front side of the connector 220. As described above, the PCB through holes 211 are spaced apart from each other in the width direction of the PCB substrate 210 and are disposed to face each other with the insertion space S interposed therebetween.

In this case, the connector 220 may be positioned to overlap the insertion space S in a direction in which a plurality of PCB through holes 211 arranged parallel to each other on one side are spaced apart from each other, that is, in the front-rear direction in the illustrated embodiment.

Therefore, the capacitor connector 430 of the capacitor assembly 400 inserted into the insertion space S may be moved in the extension direction, i.e., the front-rear direction in the illustrated embodiment, and may be coupled to or removed from the connector 220. A detailed description of the process will be described later.

Referring back to FIG. 3, the power electronic apparatus 10 according to the illustrated embodiment includes a guide member 300.

The guide member 300 guides the movement of the capacitor assembly 400 that is drawn into or withdrawn from the housing 100 and the slot member 500 coupled thereto. The capacitor assembly 400 and the slot member 500 coupled thereto may be guided in a direction in which they are drawn into or withdrawn from the housing 100 by the guide member 300.

That is, the guide member 300 guides the slide movement of the capacitor assembly 400 and the slot member 500 coupled thereto.

The guide member 300 may guide at least a portion of the capacitor assembly 400 and the slot member 500 coupled thereto. In an embodiment, the guide member 300 may guide left and right edge portions of the capacitor assembly 400 and the slot member 500 coupled thereto. In the above embodiment, it will be understood that the capacitor connector 430 is located on the front side of the capacitor assembly 400 and coupled to the connector 220.

The guide member 300 is coupled to the PCB assembly 200. Specifically, the guide member 300 may be coupled to the PCB assembly 200 by penetrating the coupling protrusion 320 into the PCB through hole 211 formed through the PCB substrate 210. In an embodiment, the guide member 300 and the PCB assembly 200 may be snap-fitted.

Accordingly, there is no need to provide a separate member, for example, a screw member, etc., for combining the guide member 300 and the PCB assembly 200. Furthermore, the man hour required to fasten the screw member or the like may be reduced.

In the illustrated embodiment, the guide member 300 is located on the upper surface of the PCB substrate 210 and is biased to the front right side.

As described above, a plurality of PCB through holes 211 may be provided. Accordingly, the guide member 300 may be coupled to the PCB substrate 210 at a plurality of positions. In the above embodiment, arbitrary rotation of the guide member 300 coupled to the PCB substrate 210 may be prevented.

In this case, the guide member 300 may be coupled to the PCB substrate 210 by forming a predetermined gap with the PCB substrate 210. In other words, the guide member 300 may be coupled to the PCB substrate 210 with forming a gap with the PCB substrate 210 in the insertion direction thereof, that is, in the up-down direction in the illustrated embodiment. The coupling may be achieved by forming an extension length of a protrusion extension 321 of the coupling protrusion 320 to be longer than an extension length of the PCB through hole 211.

Therefore, when the power electronic apparatus 10 fluctuates, the amount of impact transmitted to each other between the guide member 300 and the PCB substrate 210 may be mitigated. Accordingly, damage to the guide member 300 or the PCB substrate 210 may be prevented compared to the case where the guide member 300 is closely coupled to the PCB substrate 210.

A plurality of guide members 300 may be provided. The guide member 300 may be coupled to the PCB substrate 210 at different positions. In the embodiments illustrated in FIGS. 6 to 9, the guide member 300 is provided as a pair including a first guide member 300*a* and a second guide member 300*b*.

In an embodiment in which a plurality of guide members 300 are provided, one or more of the plurality of guide members 300 may be coupled to the PCB substrate 210 while forming a predetermined gap with the PCB substrate 210. Even in the above case, it will be understood that the impact generated in the power electronic apparatus 10 or applied from the outside may be buffered by at least one of the plurality of guide members 300.

The first guide member 300*a* is coupled to a plurality of PCB through holes 211 formed on the left side. The second guide member 300*b* is coupled to a plurality of PCB through holes 211 formed on the right side. The first guide member 300*a* and the second guide member 300*b* are disposed to face each other with the insertion space S interposed therebetween.

In this case, the distance between the first guide member 300*a* and the second guide member 300*b* is preferably formed longer than the width of the capacitor assembly 400 and the slot member 500 coupled thereto.

Therefore, even when the capacitor assembly 400 and the slot member 500 coupled thereto enter the insertion space S without being in close contact with the first guide member 300*a* or the second guide member 300*b*, they can be stably supported.

The first guide member 300*a* and the second guide member 300*b* have some differences in the position and arrangement method of being coupled to the PCB substrate 210, but the structure is the same. Accordingly, in the following description, matters common to the first guide member 300*a* and the second guide member 300*b* will be collectively referred to as the guide member 300.

Figure 10:
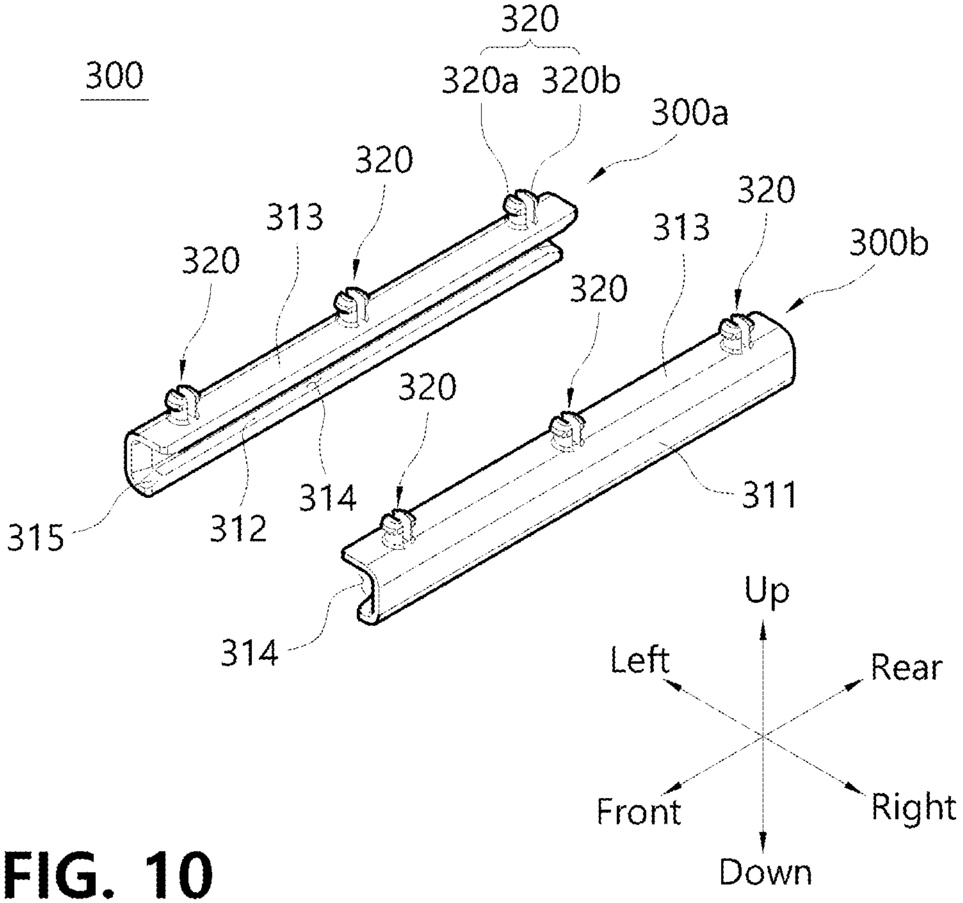
FIG. 10 is a perspective view from another angle, illustrating the guide member of FIG. 8.
Figure 11:
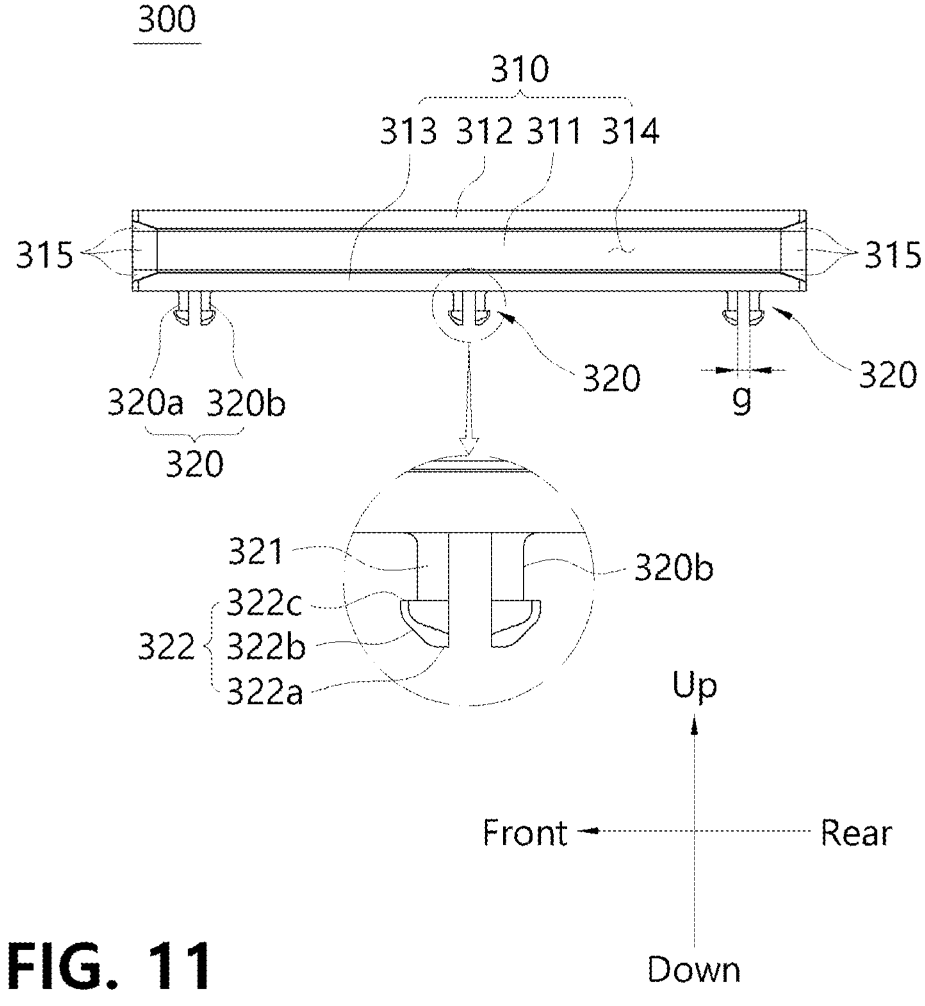
FIG. 11 is a side view illustrating the guide member of FIG. 8.

In the embodiments shown in FIGS. 10 to 11, the guide member 300 includes a guide body 310 and a coupling protrusion 320.

The guide body 310 forms a body of the guide member 300. The guide body 310 is formed to extend in the same direction as the capacitor assembly 400 and the slot member 500 coupled thereto. In the illustrated embodiment, the guide body 310 is formed to extend in the front-rear direction. The guide body 310 may support the capacitor assembly 400 and the slot member 500 coupled thereto to guide the movement thereof.

The guide body 310 is coupled to the PCB substrate 210. As described above, each surface of the guide body 310 and the PCB substrate 210 facing each other may be disposed to be spaced apart from each other. Accordingly, impact or fluctuation generated between the guide body 310 and the capacitor assembly 400 and the slot member 500 supported thereby, and the PCB substrate 210 may be buffered.

The guide body 310 may support one edge of the capacitor assembly 400 and the slot member 500 coupled thereto. In the illustrated embodiment, the first guide member 300*a* on the left supports the left edge of the capacitor assembly 400 and the slot member 500 coupled thereto. The second guide member 300*b* on the right supports the right edge of the capacitor assembly 400 and the slot member 500 coupled thereto.

In the embodiments shown in FIGS. 8 to 11, the guide body 310 includes a first extension 311, a second extension 312, a third extension 313, a guide hollow 314, and a guide inclined portion 315.

The first extension 311 forms one portion of the guide body 310. In the illustrated embodiment, the first extension 311 forms the outer side of the guide body 310 in the horizontal direction. The first extension 311 is formed to extend in the height direction of the guide body 310, that is, in the up-down direction in the illustrated embodiment.

The first extension 311 supports one edge of the capacitor assembly 400 and the slot member 500 coupled thereto in the horizontal direction. In the illustrated embodiment, the first extension 311 of the first guide member 300*a* supports the left edge of the capacitor assembly 400 and the slot member 500 coupled thereto. In addition, the first extension 311 of the second guide member 300*b* supports the right edge of the capacitor assembly 400 and the slot member 500 coupled thereto.

Therefore, it may be said that the first extension 311 prevents the capacitor assembly 400 and the slot member 500 coupled thereto entering the insertion space S from being separated in the horizontal direction.

In this case, the shortest distance between the first extensions 311 respectively formed in the first guide member 300*a* and the second guide member 300*b* is preferably formed longer than the length of the capacitor assembly 400 and the slot member 500 coupled thereto in the width direction. In the above embodiment, the capacitor assembly 400 and the slot member 500 coupled thereto entering the insertion space S may be disposed to have a predetermined gap in the horizontal direction.

The first extension 311 is formed to extend in the extension direction of the guide body 310, that is, in the front-rear direction in the illustrated embodiment. A guide inclined portion 315 is formed at each end of the first extension 311 in the extension direction, that is, at each end in the front-rear direction in the illustrated embodiment.

The first extension 311 partially surrounds the guide hollow 314 in the horizontal direction. In the illustrated embodiment, the first extension 311 of the first guide member 300*a* surrounds the left side of the guide hollow 314, and the first extension 311 of the second guide member 300*b* surrounds the right side of the guide hollow 314.

Therefore, it may be said that the first extension 311 surrounds the horizontal outer side of the guide hollow 314.

The first extension 311 is continuous with the second extension 312 and the third extension 313.

The second extension 312 forms another portion of the guide body 310. In the illustrated embodiment, the second extension 312 forms one side of the guide body 310 in the vertical direction, that is, the upper side. The second extension 312 is formed to extend in the width direction of the guide body 310, that is, in the left-right direction in the illustrated embodiment.

The second extension 312 supports one edge of the capacitor assembly 400 and the slot member 500 coupled thereto in the vertical direction. In the illustrated embodiment, the second extension 312 supports the upper edge of the capacitor assembly 400 and the slot member 500 coupled thereto.

Therefore, it may be said that the second extension 312 prevents the capacitor assembly 400 and the slot member 500 coupled thereto entering the insertion space S from being separated in the vertical direction.

The second extension 312 is formed to extend in the extension direction of the guide body 310, that is, in the front-rear direction in the illustrated embodiment. A guide inclined portion 315 is formed at each end of the second extension 312 in the extension direction, that is, at each end in the front-rear direction in the illustrated embodiment.

The second extension 312 partially surrounds the guide hollow 314 in the vertical direction. In the illustrated embodiment, the second extension 312 surrounds the upper side of the guide hollow 314.

Therefore, it may be said that the second extension 312 surrounds a portion of the outer side of the guide hollow 314 in the vertical direction.

The second extension 312 is continuous at a predetermined angle with the first extension 311. In an embodiment, the predetermined angle may be a right angle.

The second extension 312 is disposed to face the third extension 313 with the guide hollow 314 interposed therebetween.

The third extension 313 forms yet another portion of the guide body 310. In the illustrated embodiment, the third extension 313 forms the other side of the guide body 310 in the vertical direction, that is, the lower side. The third extension 313 is formed to extend in the width direction of the guide body 310, that is, in the left-right direction in the illustrated embodiment.

The third extension 313 supports the other edge of the capacitor assembly 400 and the slot member 500 coupled thereto in the vertical direction. In the illustrated embodiment, the third extension 313 supports the lower edge of the capacitor assembly 400 and the slot member 500 coupled thereto.

Therefore, it may be said that the third extension 313 prevents the capacitor assembly 400 and the slot member 500 coupled thereto entering the insertion space S from being separated in the vertical direction.

The third extension 313 is formed to extend in the extension direction of the guide body 310, that is, in the front-rear direction in the illustrated embodiment. A guide inclined portion 315 is formed at each end of the third extension 313 in the extension direction, that is, at each end in the front-rear direction in the illustrated embodiment.

The third extension 313 partially surrounds the guide hollow 314 in the vertical direction. In the illustrated embodiment, the third extension 313 surrounds the lower side of the guide hollow 314.

Therefore, it may be said that the third extension 313 surrounds another portion of the outer side of the guide hollow 314 in the vertical direction.

The third extension 313 is continuous at a predetermined angle with the first extension 311. In an embodiment, the predetermined angle may be a right angle.

The third extension 313 is disposed to face the second extension 312 with the guide hollow 314 interposed therebetween.

The guide hollow 314 is a space in which the capacitor assembly 400 and the slot member 500 coupled thereto are accommodated. The guide hollow 314 partially accommodates one side of the capacitor assembly 400 and the slot member 500 coupled thereto.

In the illustrated embodiment, the guide hollow 314 of the first guide member 300*a* accommodates the left portion of the capacitor assembly 400 and the slot member 500 coupled thereto. The guide hollow 314 of the second guide member 300*b* accommodates the right portion of the capacitor assembly 400 and the slot member 500 coupled thereto.

The guide hollow 314 is partially surrounded by the first to third extensions 311, 312, and 313. In the illustrated embodiment, one side of the guide hollow 314 in the horizontal direction is surrounded by the first extension 311. Both sides of the guide hollow 314 in the vertical direction are surrounded by the second extension 312 and the third extension 313, respectively.

One side of the guide hollow 314 in the horizontal direction is formed to be open and communicates with the insertion space S. In the illustrated embodiment, the guide hollow 314 of the first guide member 300*a* is formed to have an open right side thereof to communicate with the insertion space S. The guide hollow 314 of the second guide member 300*b* is formed to have an open left side thereof to communicate with the insertion space S.

Therefore, it may be said that the guide hollow 314 is formed to have an open inner side facing the insertion space S to communicate with the insertion space S.

The guide hollow 314 may extend in the extension direction of the guide body 310. In the illustrated embodiment, the guide hollow 314 is formed to extend in the front-rear direction. Each end of the guide hollow 314 in the extension direction is formed to be open and communicates with the outside. Accordingly, the capacitor assembly 400 and the slot member 500 coupled thereto may be slidably moved in the extension direction of the guide hollow 314.

The cross-section of the guide hollow 314 may have an arbitrary shape capable of partially accommodating the capacitor assembly 400 and the slot member 500 coupled thereto. In the illustrated embodiment, the guide hollow 314 is formed to have a quadrangular cross-section in which one side facing the insertion space S is formed to be open.

In the above embodiment, the length of the guide hollow 314 in the vertical direction may be formed longer than the height of the capacitor assembly 400 and the slot member 500 coupled thereto. Accordingly, a gap in the vertical direction of the capacitor assembly 400 and the slot member 500 coupled thereto entering the insertion space S may be formed. As a result, fluctuations of the capacitor assembly 400 and the slot member 500 in the up-down direction may be buffered.

It will be understood that the cross-section of the guide body 310 described above is in the form of a bracket in which one side thereof facing the insertion space S is formed to be open to communicate the guide hollow 314 with the insertion space S, and the other side thereof is surrounded by the first to third extensions 311, 312, and 313.

The guide inclined portion 315 guides the capacitor assembly 400 and the slot member 500 coupled thereto entering the guide hollow 314. The capacitor assembly 400 and the slot member 500 coupled thereto may be more smoothly entered into the guide hollow 314 and the insertion space S by the guide inclined portion 315.

The guide inclined portion 315 is formed at an end of the guide body 310 in the extension direction. In addition, the guide inclined portion 315 may be formed at a plurality of positions. In the illustrated embodiment, the guide inclined portion 315 is formed at the front end and the rear end of the guide body 310, respectively.

The guide inclined portion 315 may have an arbitrary shape capable of guiding the capacitor assembly 400 and the slot member 500 coupled thereto entering the insertion space S to the guide hollow 314. In the illustrated embodiment, the guide inclined portion 315 is formed to extend obliquely toward the insertion space S in a direction from one end toward the other end.

In other words, the guide inclined portion 315 is formed to be tapered in a direction toward the insertion space S.

The guide inclined portion 315 may be formed on each of the first extension 311, the second extension 312, and the third extension 313 forming the guide body 310.

In the illustrated embodiment, the guide inclined portion 315 formed on the first extension 311 is formed to extend obliquely from the inside to the outside in the horizontal direction along a direction toward the end thereof. The guide inclined portion 315 formed on the second extension 312 is formed to extend obliquely from the lower side toward the upper side along a direction toward the end thereof. The guide inclined portion 315 formed on the third extension 313 is formed to extend obliquely from the upper side toward the lower side along a direction toward the end thereof.

Therefore, the capacitor assembly 400 and the slot member 500 coupled thereto can be guided by the guide inclined portion 315 to easily enter the guide hollow 314 and the insertion space S.

The coupling protrusion 320 is a portion where the guide member 300 is coupled to the PCB assembly 200. The coupling protrusion 320 is through-coupled to the PCB through hole 211 formed through the PCB substrate 210.

The coupling protrusion 320 is formed to extend in the thickness direction of the PCB substrate 210. One end of the coupling protrusion 320 in the extension direction is located below the PCB substrate 210, and the other end of the coupling protrusion 320 in the extension direction is coupled to the guide body 310 located above the PCB substrate 210.

In the illustrated embodiment, the coupling protrusion 320 is formed to extend in the up-down direction. The lower end of the coupling protrusion 320 penetrates the PCB through hole 211 and is positioned below the PCB substrate 210. The upper end of the coupling protrusion 320 is coupled to the lower side of the guide body 310, that is, the lower side of the third extension 313.

A plurality of coupling protrusions 320 may be provided. The plurality of coupling protrusions 320 may be disposed to be spaced apart from each other along the extension direction of the guide body 310. The plurality of coupling protrusions 320 may be coupled to a plurality of PCB through holes 211, respectively.

In the illustrated embodiment, three coupling protrusions 320 are provided and disposed to be spaced apart from each other in the extension direction of the guide body 310, that is, in the front-rear direction. The number and arrangement of the coupling protrusions 320 may be changed according to the number and arrangement of the PCB through holes 211.

The coupling protrusion 320 may be coupled to the PCB substrate 210 in any form capable of being firmly coupled to the PCB substrate 210. In the illustrated embodiment, the coupling protrusion 320 may be coupled to the PCB substrate 210 in the form of a snap fitting.

Meanwhile, a plurality of coupling protrusions 320 disposed to be spaced apart from each other may also be formed. That is, a plurality of coupling protrusions 320 at each position may be provided to be coupled to the same PCB through hole 211.

In the illustrated embodiment, the coupling protrusion 320 is provided as a pair, including a first coupling protrusion **320*a* positioned on the front side and a second coupling protrusion 320*b* positioned on the rear side. The first coupling protrusion 320*a* and the second coupling protrusion 320*b* are spaced apart from each other and are disposed to face each other. A distance at which the first coupling protrusion 320*a* and the second coupling protrusion 320*b* are separated from each other may be defined as a separation distance g (see FIG. 11**).

Therefore, the first coupling protrusion **320*a* and the second coupling protrusion 320*b* may be moved in a direction toward each other by the separation distance g. That is, the first coupling protrusion 320*a* and the second coupling protrusion 320*b*** may be deformed in shape such that the width in the front-rear direction thereof is reduced by the separation distance g.

Accordingly, the first coupling protrusion **320*a* and the second coupling protrusion 320*b* may be pressed toward each other, inserted into the PCB through hole 211, and then, when penetrated through the PCB through hole 211, they may move in a direction away from each other again. Accordingly, the coupling protrusion 320 and the PCB substrate 210** may be snap-fitted.

In the illustrated embodiment, the coupling protrusion 320 includes a protrusion extension 321 and a protrusion head portion 322.

The protrusion extension 321 forms a body of the coupling protrusion 320. The protrusion extension 321 is a portion where the coupling protrusion 320 is coupled to the PCB through hole 211.

The protrusion extension 321 is coupled to the guide body 310. In the illustrated embodiment, the upper end of the protrusion extension 321 is continuous with the lower surface of the third extension 313.

The protrusion extension 321 is coupled to the PCB substrate 210. In the illustrated embodiment, the protrusion extension 321 penetrates the PCB through hole 211 to be coupled to the PCB substrate 210.

The protrusion extension 321 is formed to extend in the thickness direction of the PCB substrate 210, that is, in the up-down direction in the illustrated embodiment. In this case, the extension length of the protrusion extension 321 may be formed to be longer than the extension length of the PCB through hole 211. In the illustrated embodiment, the extension length of the protrusion extension 321 in the up-down direction is formed to be longer than the extension length of the PCB through hole 211 in the up-down direction.

By the above structure, a gap in the thickness direction, that is, in the up-down direction, between the guide member 300 and the PCB assembly 200 may be secured. As described above, fluctuations or impacts transferred between the guide member 300 and the PCB assembly 200 may be buffered by the gap.

The protrusion extension 321 may have an arbitrary shape capable of penetrating the PCB through hole 211. In the illustrated embodiment, in the protrusion extension 321, one side (i.e., a direction in which the first coupling protrusion 320*a* and the second coupling protrusion 320*b* face each other) surface facing the inside is formed as a flat surface and the other side surface is formed as a curved surface which is convex outward.

The protrusion head portion 322 is provided at one end opposite to the guide body 310 of the ends of the protrusion extension 321 in the extension direction, i.e., at the lower end in the illustrated embodiment.

The protrusion head portion 322 fixes the guide member 300 to the PCB substrate 210. The guide member 300 is not arbitrarily separated from the PCB substrate 210 thanks to the protrusion head portion 322.

The protrusion head portion 322 is continuous with the protrusion extension 321. The protrusion head portion 322 is coupled to one end of the protrusion extension 321, that is, the lower end in the illustrated embodiment.

The protrusion head portion 322 is located on one side of the PCB substrate 210 opposite to the guide body 310. In other words, the protrusion head portion 322 is disposed to face the guide body 310 with the PCB substrate 210 interposed therebetween. In the illustrated embodiment, the protrusion head portion 322 is located below the PCB substrate 210.

The protrusion head portion 322 may have a cross-section diameter larger than the cross-section diameter of the protrusion extension 321. In this case, the protrusion head portion 322 may be formed larger than the diameter of the PCB through hole 211 in a state in which the coupling protrusion 320 is not pressed. When the first coupling protrusion 320*a* and the second coupling protrusion 320*b* are pressed toward each other, the diameter of the pair of protrusion head portions 322 may be formed to be less than or equal to the diameter of the PCB through hole 211.

Accordingly, while the first coupling protrusion 320*a* and the second coupling protrusion 320*b* are pressed toward each other, the pair of protrusion head portions 322 may be inserted through the PCB through hole 211. In addition, when the external force applied to the first coupling protrusion 320*a* and second coupling protrusion 320*b* is released, the pair of protrusion head portions 322 are moved in opposite directions to each other and are not arbitrarily inserted into the PCB through hole 211.

To sum up, the diameter of the cross-section of the pair of protrusion head portions 322 is the largest in a state where the first coupling protrusion 320*a* and the second coupling protrusion 320*b* are not pressed toward each other. Next, the diameter of the cross-section of the pair of protrusion head portions 322 in a state in which the first coupling protrusion 320*a* and the second coupling protrusion 320*b* are pressed toward each other may be less than or equal to the diameter of the cross-section of the PCB through hole 211.

Furthermore, the diameter of the pair of protrusion extensions 321 may be less than or equal to the diameter of the cross-section of the PCB through hole 211.

By the above structure, the coupling protrusion 320 may be snap-fitted to the PCB substrate 210.

The protrusion head portion 322 may be divided into a plurality of portions. The plurality of portions may be formed such that the protrusion head portion 322 is easily inserted into the PCB through hole 211, but is not arbitrarily inserted into the PCB through hole 211 after penetrating the PCB through hole 211.

In the illustrated embodiment, the protrusion head portion 322 includes a head end 322*a*, a head inclined portion 322*b*, and a head extension 322*c*.

The head end 322*a* forms one end of the protrusion head portion 322. The head end 322*a* is a portion that first enters the PCB through hole 211 when the guide member 300 is coupled to the PCB substrate 210. In the illustrated embodiment, the head end 322*a* forms the lower end of the protrusion head portion 322.

The head end 322*a* is continuous with the head inclined portion 322*b*.

The head inclined portion 322*b* forms a portion of the protrusion head portion 322. In the illustrated embodiment, the head inclined portion 322*b* forms the outer side of the protrusion head portion 322 in the radial direction. That is, the head inclined portion 322*b* of the first coupling protrusion 320*a* forms the front side of the protrusion head portion 322, and the head inclined portion 322*b* of the second coupling protrusion 320*b* forms the rear side of the protrusion head portion 322.

The head inclined portion 322*b* may have an arbitrary shape in which the coupling protrusion 320 may be easily inserted into the PCB through hole 211. In the illustrated embodiment, the diameter of the cross-section of the head inclined portion 322*b* is formed to decrease in the direction in which the coupling protrusion 320 is inserted into the PCB through hole 211, that is, toward the lower side.

In other words, the head inclined portion 322*b* extends radially inward along a direction toward the head end 322*a*. Therefore, it will be understood that the cross-sectional area of one side of the head inclined portion 322*b* facing the head end 322*a* is smaller than the cross-sectional area of the other side facing the head extension 322*c*.

Therefore, as illustrated in FIG. 11, the head inclined portion 322*b* is formed to extend obliquely from the outside to the inside in a downward direction.

Accordingly, after the first coupling protrusion 320*a* and the second coupling protrusion 320*b* are pressed toward each other, the head inclined portion 322*b* may be guided by the inner surface of the PCB substrate 210 surrounding the PCB through hole 211 and may penetrate the PCB through hole 211.

The head inclined portion 322*b* is continuous with the head extension 322*c*.

The head extension 322*c* forms the other end of the protrusion head portion 322. The head extension 322*c* is a portion positioned closest to the PCB substrate 210 after the protrusion head portion 322 is withdrawn from the PCB through hole 211. In the illustrated embodiment, the head extension 322*c* forms the upper side of the protrusion head portion 322.

The head extension 322*c* is coupled to the one end in the extension direction of the protrusion extension 321, that is, the lower end in the illustrated embodiment.

The head extension 322*c* extends radially inward at a predetermined angle with the head inclined portion 322*b*. In the illustrated embodiment, the head extension 322*c* is formed to extend radially inward at an acute angle with the head inclined portion 322*b*.

In the illustrated embodiment, the radially outer end of the head extension 322*c* is continuous with the head inclined portion 322*b*. The radially inner end of the head extension 322*c* is continuous with the lower end of the protrusion extension 321.

The head extension 322*c* may be in contact with the lower surface of the PCB substrate 210 surrounding from the radially outer side the PCB through hole 211. In an embodiment, the head extension 322*c* may extend parallel to the PCB substrate 210.

Accordingly, after the coupling protrusion 320 is withdrawn through the PCB through hole 211, the coupling protrusion 320 cannot be arbitrarily drawn into the PCB through hole 211 unless external force is applied to the first coupling protrusion 320*a* and the second coupling protrusion 320*b*. As a result, the coupling state between the guide member 300 and the PCB assembly 200 may be stably maintained.

Referring back to FIGS. 2 to 3, the power electronic apparatus 10 according to the illustrated embodiment includes a capacitor assembly 400.

The capacitor assembly 400 includes a capacitor 410 to supply power for operating the PCB assembly 200 and even further the power electronic apparatus 10.

In particular, the capacitor assembly 400 according to an exemplary embodiment of the present disclosure is provided in the form of a module and is detachably coupled to the PCB assembly 200. That is, the capacitor assembly 400 is provided separately from the PCB assembly 200.

Therefore, when maintenance of the capacitor 410 is required, only the capacitor assembly 400 can be separated without the separation process of the entire PCB assembly 200.

In addition, the capacitor assembly 400 may be maintained in a state of being coupled to the housing 100 and the PCB assembly 200 without a separate fastening member. Accordingly, members and man hours for coupling the capacitor assembly 400 with other members may be reduced.

The capacitor assembly 400 is inserted into and coupled to the housing 100 to be withdrawable therefrom. The capacitor assembly 400 may be drawn into the accommodation space 104 of the housing 100 through the insertion opening 110.

The capacitor assembly 400 is energized with the PCB assembly 200. The capacitor connector 430 of the capacitor assembly 400 may be inserted into and coupled to the connector 220 of the PCB assembly 200 to be energized with the PCB assembly 200.

The movement of the capacitor assembly 400 is guided by the guide member 300. Specifically, the capacitor assembly 400 may be accommodated in the guide hollow 314 of the guide member 300 to be slidably moved along the extension direction of the guide member 300. In this case, a pair of edges of the capacitor assembly 400 may be guided by the first extension 311, the second extension 312, and the third extension 313.

In the illustrated embodiment, the left and right edges of the capacitor assembly 400 may be accommodated in the guide hollow 314 and supported by the guide member 300 to be slidably movable to the front side and the rear side.

The capacitor assembly 400 is coupled to the slot member 500. The capacitor assembly 400 is detachably coupled to the slot member 500 and may be moved together with the slot member 500. Accordingly, not only can the movement of the capacitor assembly 400 proceed smoothly, but also the rigidity of the capacitor assembly 400, especially the capacitor substrate 420, can be reinforced. This will be described later in detail.

In the illustrated embodiment, a single capacitor assembly 400 and a single slot member 500 coupled to the capacitor assembly 400 are provided. Alternatively, a plurality of capacitor assemblies 400 and slot members 500 may be provided. Each of the plurality of capacitor assemblies 400 and the slot members 500 coupled thereto may be withdrawably accommodated in the housing 100 and may be provided to be energized with the PCB assembly 200.

In the above embodiment, when maintenance of any one of the plurality of capacitor assemblies 400 is required, only the corresponding capacitor assembly 400 may be withdrawn to perform the operation. That is, for maintenance of the capacitor assembly 400, it is not required to stop the operation of the entire power electronic apparatus 10.

Figure 12:
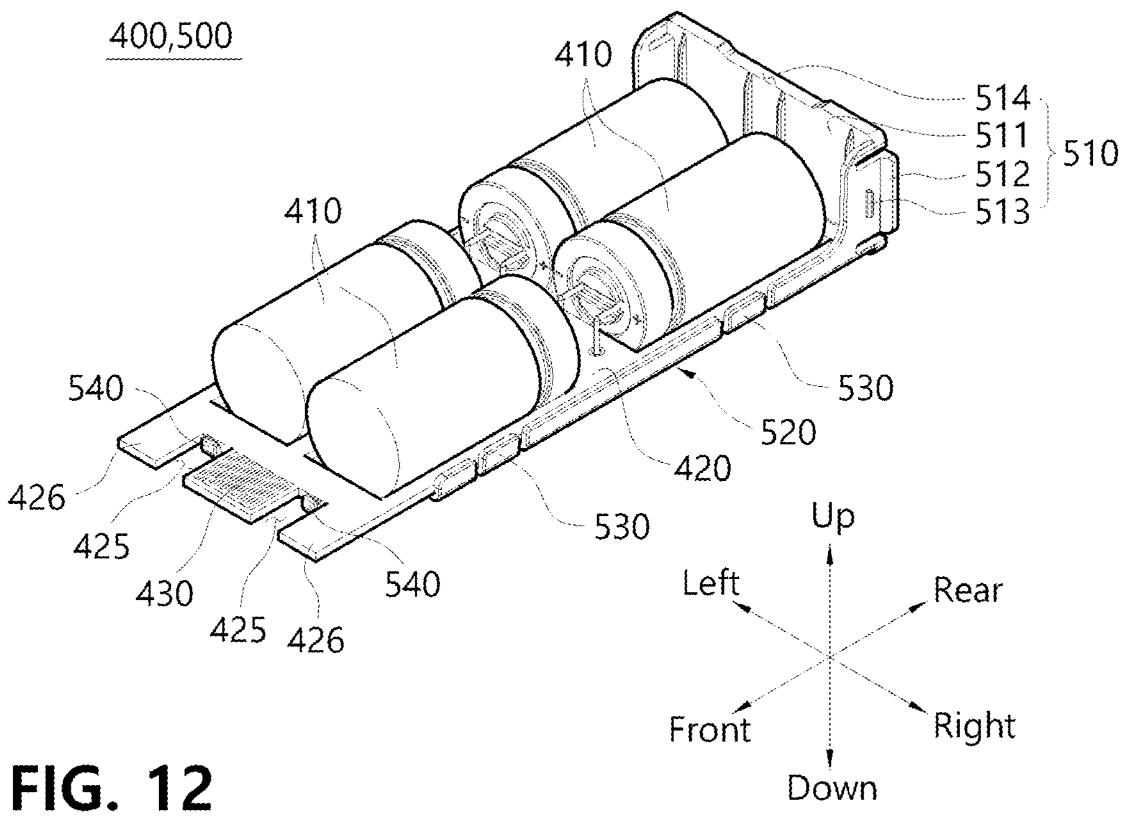
FIG. 12 is a perspective view illustrating the capacitor assembly of FIGS. 2 and 3.
Figure 13:
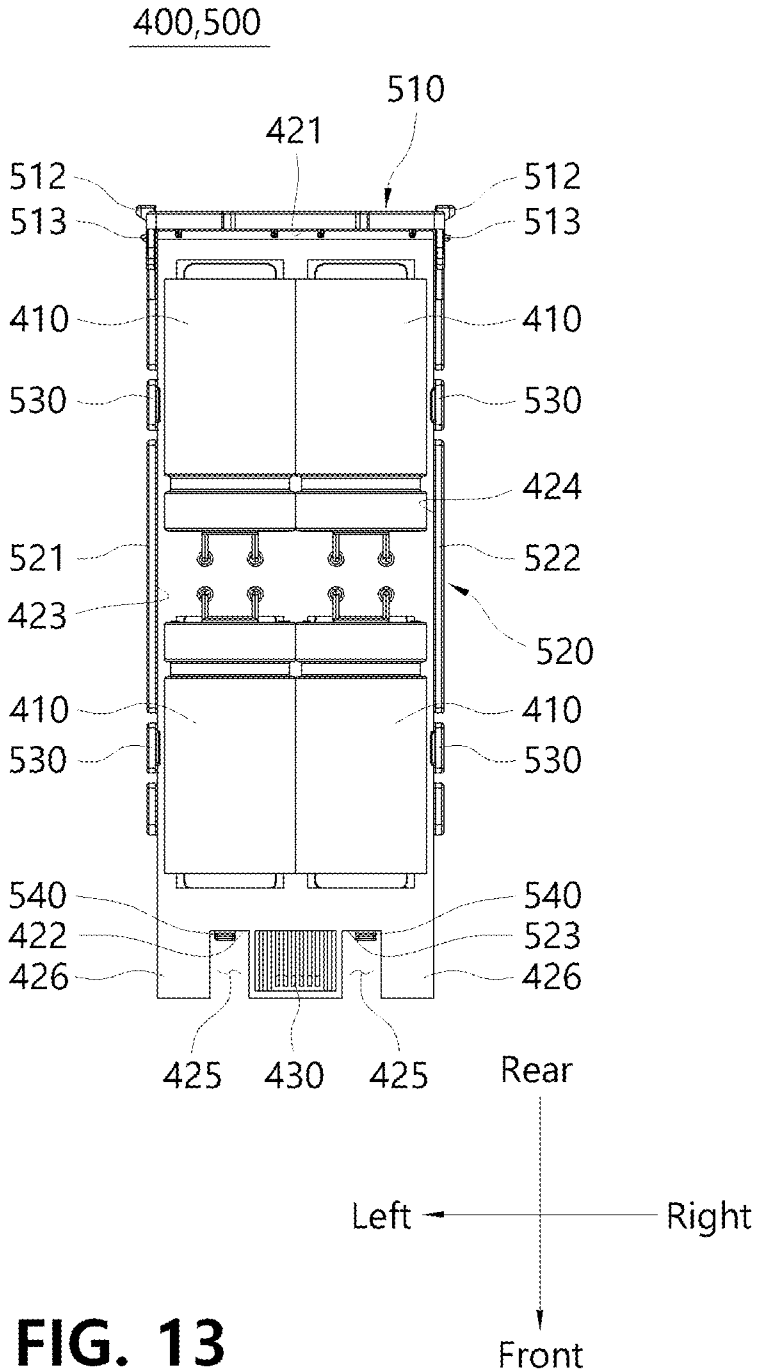
FIG. 13 is a plan view illustrating the capacitor assembly of FIG. 12.
Figure 14:
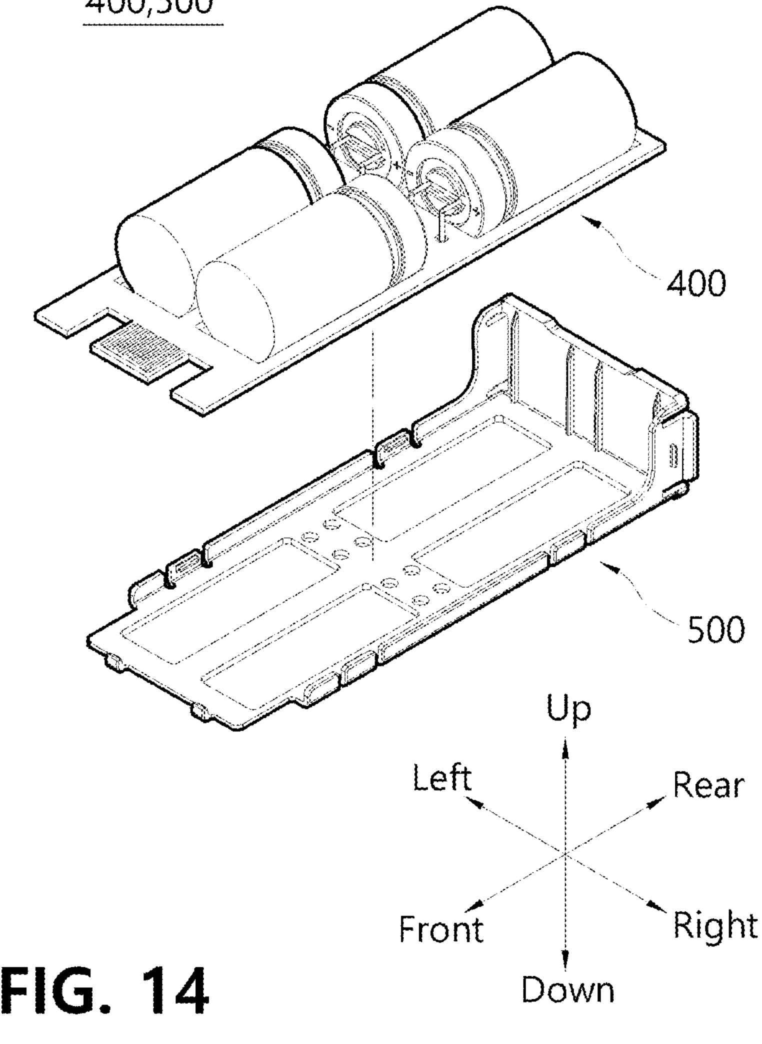
FIG. 14 is an exploded perspective view illustrating a capacitor module and a slot member of the capacitor assembly of FIG. 12.
Figure 15:
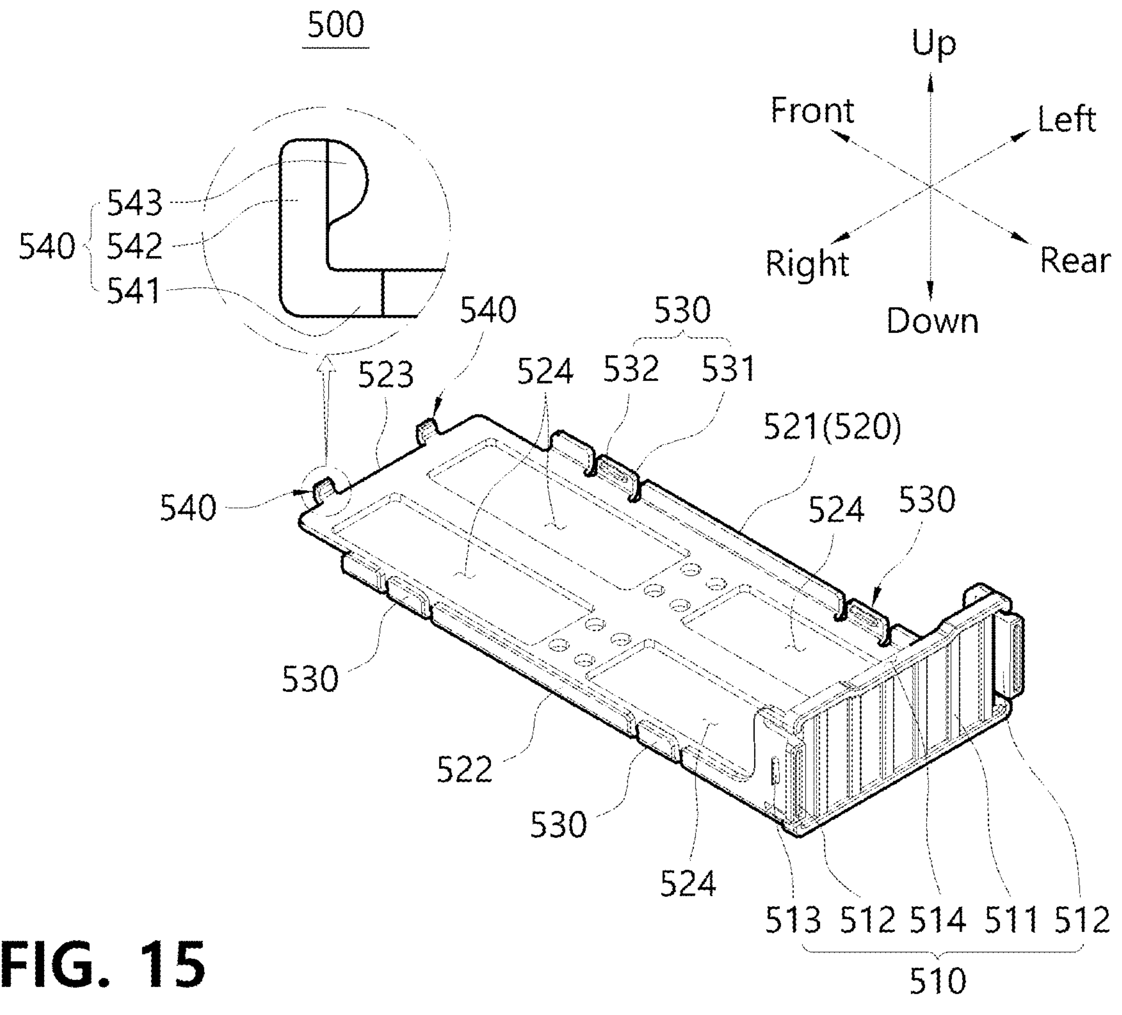
FIG. 15 is a perspective view from another angle, illustrating the slot member of FIG. 14.
Figure 16:
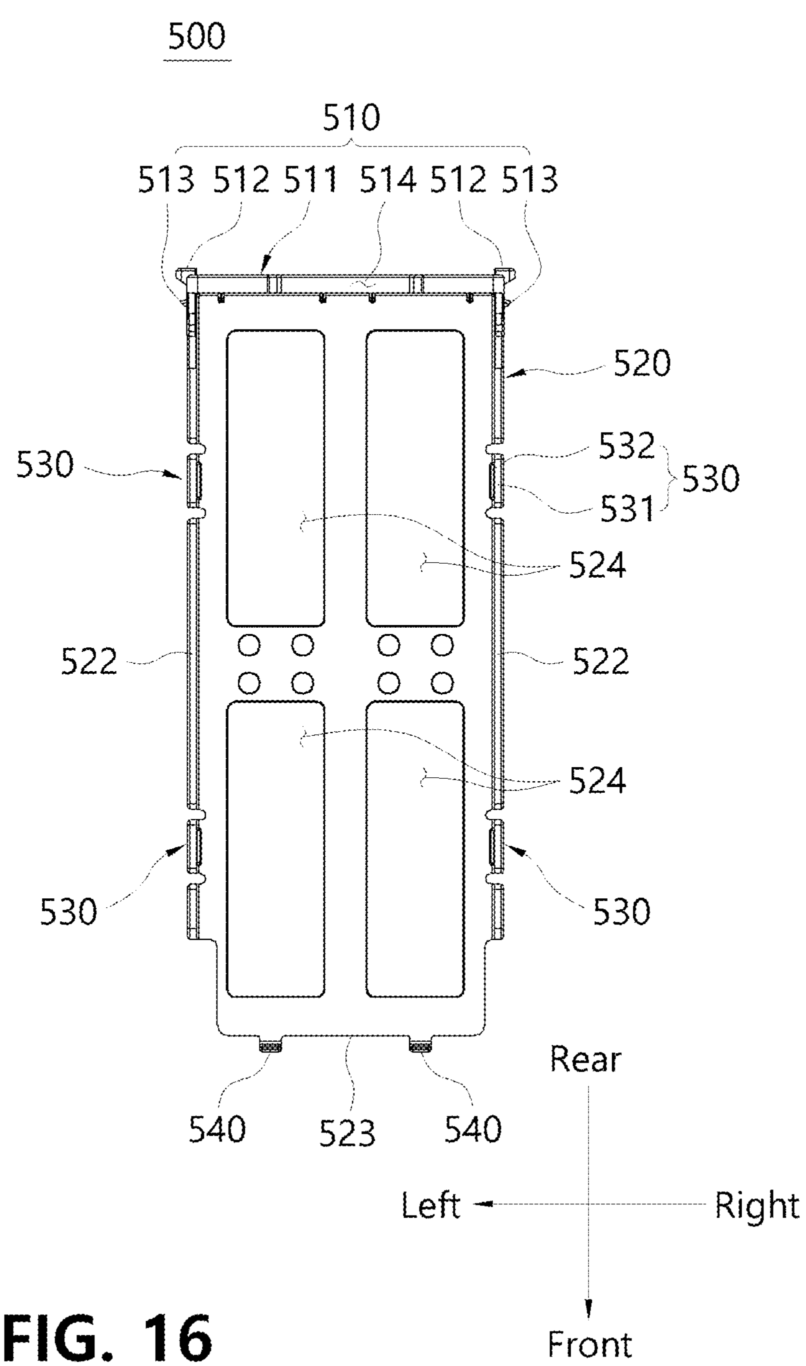
FIG. 16 is a plan view illustrating the slot member of FIG. 14.

Referring to FIGS. 12 to 14, according to the illustrated embodiment includes a capacitor 410, a capacitor substrate 420, and a capacitor connector 430.

The capacitor 410 is charged by an external power source to store power. The capacitor 410 is energized with the PCB assembly 200 to transmit the stored power. The power electronic apparatus 10 may be operated by the power.

The capacitor 410 is energized with the capacitor substrate 420. The power stored in the capacitor 410 may be transmitted to the PCB assembly 200 through the capacitor substrate 420 and the capacitor connector 430 energizably coupled thereto.

The capacitor 410 is detachably coupled to the capacitor substrate 420. In other words, the capacitor 410 is manufactured separately from the capacitor substrate 420 and is coupled to the capacitor substrate 420.

Therefore, when maintenance of the capacitor 410 is required, only the capacitor 410 may be separated from the capacitor substrate 420 to be maintained or replaced. Accordingly, since the capacitor substrate 420 without abnormality may be used as it is, work convenience may be improved and time and financial cost may be reduced.

The capacitor 410 may be provided in an arbitrary form that may be charged by an external power source to store power and transmit the stored power to the PCB assembly 200. In the illustrated embodiment, the capacitor 410 has a cylindrical shape having a circular cross-section and extending in the front-rear direction.

In an embodiment in which the capacitor 410 is provided in a cylindrical shape, the capacitor 410 may be coupled to partially penetrate the capacitor substrate 420. That is, in the embodiment shown in FIG. 12, a portion of the lower side of the outer circumference of the capacitor 410 may penetrate an opening (reference numeral not indicated) formed in the capacitor substrate 420, and the remaining portion of the lower side may be supported by the upper surface of the capacitor substrate 420 surrounding the opening.

A plurality of capacitors 410 may be provided. Each of the plurality of capacitors 410 may be coupled to the capacitor substrate 420 to be energized with the capacitor substrate 420. In the illustrated embodiment, four capacitors 410 are provided. One pair of capacitors 410 of the four capacitors 410 are arranged to be biased to the front side, and the other pair of capacitors 410 are arranged to be biased to the rear side.

In an embodiment, the capacitor 410 may be formed to extend in the same direction as the extension direction of the capacitor substrate 420, and may be disposed in parallel along the extension direction. In the illustrated embodiment, the capacitor 410 has a longer extension length in the front-rear direction, the same as the capacitor substrate 420, and is disposed parallel along the front-rear direction.

It will be understood that the extension direction of the capacitor 410 and the capacitor substrate 420 is the same as the direction in which the capacitor assembly 400 and the slot member 500 are drawn into or withdrawn from the housing 100.

The capacitor substrate 420 transmits the power stored in the capacitor 410 to the PCB assembly 200. Accordingly, it may be said that the capacitor substrate 420 energizes the capacitor 410 and the PCB assembly 200.

The capacitor substrate 420 is coupled to the capacitor 410. In the illustrated embodiment, the capacitor substrate 420 is coupled to the lower side of the capacitor 410 to support the capacitor substrate 420.

As described above, in an embodiment in which the capacitor 410 is provided in a cylindrical shape, an opening formed through the capacitor substrate 420 may be formed at a position corresponding to the capacitor 410. The opening may be configured to partially accommodate a portion of the capacitor 410, that is, a portion of the lower side in the illustrated embodiment. At the same time, the portion of the capacitor 410 may be accommodated in a capacitor accommodation portion 524 formed in the slot member 500.

The capacitor substrate 420 is energized with the capacitor 410. The power stored in the capacitor 410 may be transmitted to the capacitor substrate 420.

The capacitor substrate 420 may include a plurality of electrical elements. The capacitor substrate 420 may receive a control signal and control movement of the capacitor 410 and power accordingly.

The capacitor substrate 420 is energized with the capacitor connector 430. The power transmitted to the capacitor substrate 420 may be transmitted to the PCB assembly 200 through the capacitor connector 430.

The capacitor substrate 420 is coupled to the slot member 500. Specifically, the capacitor substrate 420 is partially supported by a capacitor support portion 530 formed in a slot body 520 of the slot member 500. In addition, the other part of the capacitor substrate 420 is supported by a latching protrusion 540. This will be described later in detail.

The capacitor substrate 420 may be formed in a shape corresponding to the shape of the slot member 500. In the illustrated embodiment, the capacitor substrate 420 is formed in a quadrangular plate shape in which the extension length in the front-rear direction is longer than the extension length in the left-right direction, with a thickness in the up-down direction. As described above, the direction in which the capacitor substrate 420 extends longer is the same as the direction in which the capacitor assembly 400 is drawn into or withdrawn from the accommodation space 104.

In the illustrated embodiment, the capacitor substrate 420 includes a first edge 421, a second edge 422, a third edge 423, a fourth edge 424, a support space portion 425, and a support extension 426.

The first edge 421 forms an edge of the capacitor substrate 420. In the illustrated embodiment, the first edge 421 forms the rear edge of the capacitor substrate 420. The first edge 421 is formed to extend in the width direction of the capacitor substrate 420, that is, in the left-right direction in the illustrated embodiment.

The first edge 421 is positioned adjacent to the gripping portion 510 of the slot member 500. The first edge 421 is supported by the gripping portion 510 in the extension direction of the capacitor substrate 420, that is, in the front-rear direction in the illustrated embodiment.

The first edge 421 is disposed to face the second edge 422 with the capacitor 410 and an opening partially accommodating the capacitor 410 interposed therebetween. In addition, the first edge 421 is continuous with the third edge 423 and the fourth edge 424.

The second edge 422 forms another edge of the capacitor substrate 420. In the illustrated embodiment, the second edge 422 forms the front edge of the capacitor substrate 420. The second edge 422 is formed to extend in the width direction of the capacitor substrate 420, that is, in the left-right direction in the illustrated embodiment.

The second edge 422 is positioned adjacent to the latching protrusion 540 of the slot member 500. The second edge 422 is supported by the latching protrusion 540 in the extension direction of the capacitor substrate 420, that is, in the front-rear direction in the illustrated embodiment.

Therefore, when the capacitor assembly 400 is drawn into the housing 100, the first edge 421 is supported by the gripping portion 510, so that the capacitor connector 430 may be inserted into the connector 220 and drawn into the housing 100.

In addition, when the capacitor assembly 400 is withdrawn from the housing 100, the second edge 422 is supported by the latching protrusion 540, so that the capacitor connector 430 may be separated from the connector 220 and withdrawn from the housing 100.

The second edge 422 is disposed to face the first edge 421 with the capacitor 410 and an opening partially accommodating the capacitor 410 interposed therebetween. In addition, the second edge 422 is continuous with the third edge 423 and the fourth edge 424.

The third edge 423 forms yet another edge of the capacitor substrate 420. In the illustrated embodiment, the third edge 423 forms a left edge of the capacitor substrate 420. The third edge 423 is formed to extend in the length direction of the capacitor substrate 420, that is, in the front-rear direction in the illustrated embodiment.

The third edge 423 is positioned adjacent to a first wall 521 of the slot member 500. The third edge 423 is partially supported by the first wall 521.

The third edge 423 is detachably coupled to the capacitor support portion 530. Specifically, the third edge 423 is pressed and supported, by a support protrusion 532 of the capacitor support portion 530 located on the left, in a direction toward the slot member 500, that is, downward in the illustrated embodiment.

The third edge 423 is disposed to face the fourth edge 424 with the capacitor 410 and an opening partially accommodating the capacitor 410 interposed therebetween. In addition, the third edge 423 is continuous with the first edge 421 and the second edge 422.

The fourth edge 424 forms still yet another edge of the capacitor substrate 420. In the illustrated embodiment, the fourth edge 424 forms a right edge of the capacitor substrate 420. The fourth edge 424 is formed to extend in the length direction of the capacitor substrate 420, that is, in the front-rear direction in the illustrated embodiment.

The fourth edge 424 is positioned adjacent to a second wall 522 of the slot member 500. The fourth edge 424 is partially supported by the second wall 522. Specifically, the fourth edge 424 is pressed and supported, by a support protrusion 532 of the capacitor support portion 530 located on the right, in a direction toward the slot member 500, that is, downward in the illustrated embodiment.

The fourth edge 424 is disposed to face the third edge 423 with the capacitor 410 and an opening partially accommodating the capacitor 410 interposed therebetween. In addition, the fourth edge 424 is continuous with the first edge 421 and the second edge 422.

The support space portion 425 is a space in which the latching protrusion 540 of the slot member 500 is accommodated. The support space portion 425 is positioned adjacent to one end of the capacitor substrate 420 in the extension direction, that is, to the front end in the illustrated embodiment. In other words, the support space portion 425 is located adjacent to the second edge 422.

The support space portion 425 may be partially surrounded by the second edge 422, the capacitor connector 430, and the support extension 426.

In the illustrated embodiment, the rear side of the support space portion 425 is surrounded by the second edge 422. The inner side of the support space portion 425 (i.e., the right side of the left support space portion 425 and the left side of the right support space portion 425) is surrounded by the capacitor connector 430. Furthermore, the outer side of the support space portion 425 (i.e., the left side of the left support space portion 425 and the right side of the right support space portion 425) is surrounded by the support extension 426.

Another part of the support space portion 425, i.e., the front side in the illustrated embodiment, is formed to be open. The latching protrusion 540 may enter the support space portion 425 through a portion in which the support space portion 425 is open, that is, the front side thereof in the illustrated embodiment.

A plurality of support space portions 425 may be formed. The plurality of support space portions 425 may accommodate the latching protrusion 540 at different positions. In the illustrated embodiment, the support space portion 425 is formed on the left and right sides, respectively. In other words, the pair of support space portions 425 are disposed to face each other in the width direction of the capacitor substrate 420 with the capacitor connector 430 interposed therebetween.

That is, the plurality of support space portions 425 are partitioned by the capacitor connector 430.

The support space portion 425 is partially surrounded by the support extension 426.

The support extension 426 partially surrounds the support space portion 425 together with the second edge 422 and the capacitor connector 430. The latching protrusion 540 accommodated in the support space portion 425 may be stably maintained in the support space portion 425 by the support extension 426.

The support extension 426 is continuous with the second edge 422. The support extension 426 is formed to extend from the second edge 422, forming a predetermined angle with respect to the second edge 422. In the illustrated embodiment, the support extension 426 is formed to extend toward the front side perpendicular to the second edge 422.

A plurality of support extensions 426 may be provided. The plurality of support extensions 426 may be spaced apart from each other to extend from the second edge 422 at different positions. In the illustrated embodiment, a pair of support extensions 426 are provided.

In the above embodiment, any one support extension 426 extends from one end of the second edge 422 in the extension direction, that is, from the left end in the illustrated embodiment toward the front side. The other one support extension 426 extends from the other end of the second edge 422 in the extension direction, that is, from the right end in the illustrated embodiment toward the front side.

In an embodiment, the extension length of the support extension 426 may be the same as the extension length of the capacitor connector 430. That is, an end of the support extension 426 in the extension direction may be positioned on the same line as an end of the capacitor connector 430 in the extension direction.

The support extension 426 surrounds the support space portion 425 from the outside in the width direction. In an embodiment in which a pair of support extensions 426 are provided, the support extension 426 located on the left side surrounds the left side of the support space portion 425 located on the left side. In the above embodiment, the support extension 426 located on the right side surrounds the right side of the support space portion 425 located on the right side.

In addition, the support extension 426 surrounds the connector 220 to which the capacitor connector 430 is coupled from the outside in the width direction. In the illustrated embodiment, the support extension 426 located on the left side surrounds the left side of the connector 220, and the support extension 426 located on the right side surrounds the right side of the connector 220.

The pair of support extensions 426 are positioned to be spaced apart from each other by a predetermined distance in the width direction of the capacitor substrate 420, that is, in the left-right direction in the illustrated embodiment. In an embodiment, the shortest distance between the pair of support extensions 426 may be formed to be greater than or equal to the length of the width of the connector 220 of the PCB assembly 200, that is, the length in the left-right direction.

The capacitor connector 430 is positioned between the pair of support extensions 426.

The capacitor connector 430 is a portion where the capacitor assembly 400 is energized with the PCB assembly 200. The capacitor connector 430 is coupled to the connector 220 of the PCB assembly 200 and energized with the connector 220.

The power stored in the capacitor 410 may be transmitted to the PCB assembly 200 through the capacitor substrate 420 and the capacitor connector 430.

The capacitor connector 430 is coupled to the capacitor substrate 420. The capacitor connector 430 is positioned at one end in a direction in which the capacitor substrate 420 extends, that is, at the front end in the illustrated embodiment. The capacitor connector 430 is energized with the capacitor substrate 420.

The capacitor connector 430 is formed to extend in a direction opposite to the one end of the capacitor substrate 420, that is, toward the front side in the illustrated embodiment. One end of the capacitor connector 430 in the extension direction, that is, the front end in the illustrated embodiment may be positioned on the same line in the left-right direction as one end of the support extension 426 in the same direction, that is, the front end in the illustrated embodiment.

In other words, the capacitor connector 430 and the support extension 426 may have the same extension length.

The connector 220 may be positioned on a virtual straight line extending the extension direction of the capacitor connector 430. Accordingly, the capacitor connector 430 and the connector 220 may be coupled simply by sliding the capacitor assembly 400 toward the connector 220.

A pair of support space portions 425 are formed in the width direction of the capacitor connector 430, that is, in the left-right direction in the illustrated embodiment. The connector 220 may be partially accommodated in the pair of support space portions 425 and may be coupled to and energized with the capacitor connector 430.

The capacitor connector 430 may be provided in any form that may be detachably coupled to the connector 220. In the illustrated embodiment, the capacitor connector 430 may be withdrawably inserted into the connector 220 provided in the form of a slot.

Referring back to FIGS. 2 to 3, the power electronic apparatus 10 according to the illustrated embodiment includes a slot member 500.

The slot member 500 supports the capacitor assembly 400. In addition, the slot member 500 is supported by the guide member 300 along with the capacitor assembly 400 and is withdrawably accommodated in the housing 100.

In particular, the slot member 500 according to an exemplary embodiment of the present disclosure includes a component to be coupled to the capacitor assembly 400 and a component to be coupled to the housing 100. The slot member 500 may be detachably coupled to the capacitor assembly 400 and the housing 100, respectively, without a separate fastening member by the above components.

In this case, in order for the slot member 500 to be removed from the capacitor assembly 400 or the housing 100, an external force by an operator must be applied. In other words, unless a separate external force is applied to the slot member 500, the slot member 500 remains coupled to the capacitor assembly 400 or the housing 100.

Therefore, the slot member 500 can be easily coupled to the capacitor assembly 400 or the housing 100 without a separate tool or fastening member. Furthermore, the slot member 500 may be easily separated from the capacitor assembly 400 or the housing 100 without a separate tool.

The slot member 500 is inserted into and coupled to the housing 100 to be withdrawable therefrom. The slot member 500 may be drawn into the accommodation space 104 of the housing 100 through the insertion opening 110. In addition, the slot member 500 may be detachably coupled to the support frame 120.

The movement of the slot member 500 is guided by the guide member 300. Specifically, the edge in the extension direction of the slot member 500 may be partially accommodated in the guide hollow 314 of the guide member 300. The slot member 500 may slide along the extension direction of the guide member 300 and may be drawn into the housing 100 or withdrawn from the housing 100.

In this case, the edge of the slot member 500 may be guided by the first extension 311, the second extension 312, and the third extension 313.

The slot member 500 is coupled to the capacitor assembly 400. The slot member 500 supports the capacitor assembly 400 on one side, that is, on the lower side in the illustrated embodiment, but may be disposed to surround some edges thereof. In the illustrated embodiment, the slot member 500 surrounds the first edge 421, the third edge 423, and the fourth edge 424 of the capacitor assembly 400 and is coupled to the capacitor assembly 400.

In the illustrated embodiment, the slot member 500 is manufactured and provided separately from the capacitor assembly 400 to be coupled to the capacitor assembly 400. Alternatively, the slot member 500 may be integrally formed with the capacitor assembly 400.

For example, the capacitor assembly 400 and the slot member 500 may be formed in a form in which the capacitor substrate 420 and the capacitor connector 430 are integrally formed with the slot member 500 and then the capacitor 410 is coupled to and energized with the capacitor substrate 420.

In the illustrated embodiment, a single capacitor assembly 400 and a single slot member 500 are provided, respectively, but alternatively, a plurality of capacitor assemblies 400 and a plurality of slot members 500 may be provided in a corresponding number as described above.

Referring back to FIGS. 12 to 14 and 15 to 17, the slot member 500 according to the illustrated embodiment includes a gripping portion 510, a slot body 520, a capacitor support portion 530, and a latching protrusion 540.

The gripping portion 510 is a portion of the slot member 500 that is manipulated by an operator. When the slot member 500 is coupled to the housing 100, the gripping portion 510 is exposed to the outside of the housing 100. An operator may grip the exposed gripping portion 510 to couple the slot member 500 and the capacitor assembly 400 coupled thereto to the housing 100 or may withdraw them from the housing 100.

The gripping portion 510 forms one end of the slot member 500 in the extension direction. The one end may be defined as an end in a direction opposite to the housing 100 or the PCB assembly 200. In the illustrated embodiment, the gripping portion 510 forms a rear end of the slot member 500 extending in the front-rear direction.

The gripping portion 510 is detachably coupled to the housing 100 and may have any shape that may be identified from the outside by an operator. In the illustrated embodiment, the gripping portion 510 is formed in a polygonal plate shape having an extension length in the left-right direction longer than an extension length in the up-down direction and a thickness in the front-rear direction.

The shape of the gripping portion 510 may be changed to correspond to the shape of the insertion opening 110 and the support frame 120 surrounding the same.

The gripping portion 510 may be partially accommodated in the insertion opening 110 and the gripping space portion 130, respectively. In addition, the gripping portion 510 is detachably coupled to the support frame 120, so that a coupling state between the gripping portion 510 and the housing 100 may be maintained unless external force is applied. This will be described later in detail.

When the gripping portion 510 is accommodated in the insertion opening 110, the outer surface of the gripping portion 510 and the outer surface of the housing 100, that is, the rear side surface in the illustrated embodiment, may be positioned on the same plane. That is, the gripping portion 510 is disposed so as not to protrude relatively from the outer surface of the housing 100.

Accordingly, the degree of freedom of arrangement of the power electronic apparatus 10 may be improved.

In the illustrated embodiment, a plurality of ribs extending in the height direction, that is, in the up-down direction, are formed on the outer surface of the gripping portion 510. The rib reinforces the rigidity of the gripping portion 510 and simultaneously forms uniformity of the appearance with the outer surface of the housing 100.

In the illustrated embodiment, the gripping portion 510 includes a gripping body 511, a pressing protrusion 512, an insertion protrusion 513, and an identification recessed portion 514.

The gripping body 511 forms a body of the gripping portion 510. The gripping body 511 is a portion where the gripping portion 510 is coupled to the slot body 520. In addition, the gripping body 511 is a portion where the slot member 500 accommodated in the housing 100 is exposed to the outside.

The gripping body 511 is accommodated in the insertion opening 110. The gripping body 511 is disposed to be surrounded by the support frame 120 surrounding the insertion opening 110.

The gripping body 511 may be formed in a shape corresponding to the shape of the gripping portion 510. In the illustrated embodiment, the gripping body 511 is formed in a polygonal plate shape having an extension length in the left-right direction longer than an extension length in the up-down direction and a width in the front-rear direction.

In this case, the gripping body 511 may be formed in a structure symmetrical in the width direction, that is, in the left-right direction in the illustrated embodiment. In addition, the gripping body 511 may be formed in a structure asymmetrical in the height direction, that is, in the up-down direction in the illustrated embodiment. The asymmetry may be formed by the identification recessed portion 514.

Therefore, an operator can easily recognize the insertion direction of the slot member 500 and the capacitor assembly 400 coupled thereto through the shape of the gripping body 511.

The gripping body 511 is coupled to the slot body 520. In the illustrated embodiment, the front end of the gripping body 511 is coupled to the rear end of the slot body 520.

A plurality of ribs may be formed on the outer surface of the gripping body 511, that is, on the rear side surface in the illustrated embodiment. The plurality of ribs may be disposed to be spaced apart from each other to reinforce the rigidity of the gripping body 511 and form uniformity of the appearance with the outer surface of the housing 100.

A pressing protrusion 512 is formed at each end in the width direction of the gripping body 511, that is, at the left end and the right end in the illustrated embodiment.

The pressing protrusion 512 is pressed by an operator to be deformed in shape. The pressing protrusion 512 is connected to the insertion protrusion 513, and when the pressing protrusion 512 is pressed and deformed in shape, the insertion protrusion 513 may be separated from the support frame 120. Accordingly, the coupling state between the gripping portion 510 and the support frame 120 is released, so that the slot member 500 and the capacitor assembly 400 coupled thereto may be withdrawn from the housing 100.

The pressing protrusion 512 is coupled to the gripping body 511. A plurality of pressing protrusions 512 may be provided, and the pressing protrusions 512 may be positioned at each end of the gripping body 511 in the extension direction. In the illustrated embodiment, a pair of pressing protrusions 512 are provided and are positioned at the left end and the right end of the gripping body 511, respectively.

In a state in which external force is not applied, the pressing protrusion 512 may be positioned to be spaced apart from the gripping body 511 by a predetermined distance. When an external force is applied, the pressing protrusion 512 may be moved toward the ends of the gripping body 511. In other words, the pressing protrusion 512 is moved inward by the applied external force.

At this time, the insertion protrusion 513 connected to the pressing protrusion 512 may also be moved in the same direction, that is, inward, so that the coupling with the support frame 120 may be released.

When the slot member 500 is coupled to the housing 100, the insertion protrusion 513 is pressed by the support frame 120 and, in a state of being moved inward, is moved in a direction toward the accommodation space 104 of the housing 100.

In this case, the pressing protrusion 512 coupled to the insertion protrusion 513 is moved inward by the pressing and is maintained in a pressed state. When the slot member 500 is completely inserted, the pressing state of the insertion protrusion 513 by the support frame 120 is released, and the pressing protrusion 512 may be returned to the position before pressing.

The pressing protrusion 512 may be formed of a material having a predetermined elasticity. The pressing protrusion 512 may be formed of any material that is deformed in shape by an external force, stores a restoring force, and may be restored to its original shape when the applied external force is released. In an embodiment, the pressing protrusion 512 may be formed of a synthetic resin material such as polycarbonate-acrylonitrile-butadiene-styrene (PC-ABS).

The pressing protrusion 512 is accommodated in the gripping space portion 130 of the housing 100. The pressing protrusion 512 is accommodated in the gripping space portion 130 so as not to protrude from the outer surface of the housing 100. Accordingly, the pressing protrusion 512 may not be arbitrarily pressed in the process of installing and moving the power electronic apparatus 10.

In an embodiment in which a plurality of pressing protrusions 512 are provided, a plurality of pressing protrusions 512 may be accommodated in a plurality of gripping space portions 130, respectively. In the illustrated embodiment, the pressing protrusion 512 located on the left side is accommodated in the first gripping space portion 131, and the pressing protrusion 512 located on the right side is accommodated in the second gripping space portion 132.

The pressing protrusion 512 may be formed in an arbitrary shape that may be coupled to the insertion protrusion 513 and moved together. In the illustrated embodiment, the pressing protrusion 512 is formed so that the width of one side thereof facing the outer surface of the gripping body 511, that is, the width of the rear side, is greater than the width of the front side, and so that the insertion protrusion 513 is coupled to the outside of the front side in the width direction.

The insertion protrusion 513 is moved together with the pressing protrusion 512 to couple or separate the slot member 500 to/from the housing 100. The insertion protrusion 513 is connected to the pressing protrusion 512.

The insertion protrusion 513 is formed to protrude from the outer surface of the pressing protrusion 512. As described above, the pressing protrusion 512 includes one surface extending in the extension direction of the slot member 500, that is, in the front-rear direction in the illustrated embodiment. The insertion protrusion 513 is formed to protrude toward the outside of the one surface.

A plurality of insertion protrusions 513 may be formed. The plurality of insertion protrusions 513 may be coupled to the plurality of pressing protrusions 512, respectively, to be moved together with the plurality of pressing protrusions 512. In the illustrated embodiment, a pair of insertion protrusions 513 may be provided, and may be coupled to a pair of pressing protrusions 512 to be moved together.

The insertion protrusion 513 may be disposed at a predetermined position in the extension direction of the pressing protrusion 512, that is, in the front-rear direction in the illustrated embodiment. In an embodiment, the distance between the insertion protrusion 513 and the outer end of the pressing protrusion 512 (i.e., the rear end in the illustrated embodiment) may be formed to be greater than or equal to the thickness of the support frame 120 (i.e., the length in the front-rear direction in the illustrated embodiment).

Therefore, when the insertion of the slot member 500 is started, the insertion protrusion 513 is pressed and moved by the support frame 120. When the slot member 500 is sufficiently inserted, that is, when the slot member 500 is inserted by the separation distance between the insertion protrusion 513 and the outer end of the pressing protrusion 512, the pressing state by the support frame 120 is released.

Accordingly, the insertion protrusion 513 is moved inward while surrounding the inner end of the support frame (120), that is, the front end in the illustrated embodiment. By the above movement, the insertion protrusion 513 may be coupled to the support frame 120.

Therefore, it may be said that the insertion protrusion 513 and the support frame 120 are snap-fitted.

The insertion protrusion 513 may have any shape that may be detachably coupled to the support frame 120. In the illustrated embodiment, the insertion protrusion 513 is formed to have an extension length in the up-down direction longer than an extension length in the left-right direction and a thickness in the left-right direction. In this case, each edge of the insertion protrusion 513 is chamfered, so that it can be easily coupled to and separated from the support frame 120.

A detailed description of a process in which the slot member 500 and the capacitor assembly 400 coupled thereto are coupled to and separated from the housing 100 according to the operation of the pressing protrusion 512 and the insertion protrusion 513 will be described later.

The identification recessed portion 514 is a portion that is identified by an operator and helps recognize the insertion direction of the slot member 500 and the capacitor assembly 400 coupled thereto. The identification recessed portion 514 is disposed to align with the identification protrusion 125 of the support frame 120.

The identification recessed portion 514 is formed by being recessed at one edge of the gripping body 511. The identification recessed portion 514 may be formed in a shape corresponding to the shape of the identification protrusion 125 of the support frame 120.

In the illustrated embodiment, the identification protrusion 125 is formed to protrude from the fourth portion 124 toward the insertion opening 110. Accordingly, the identification recessed portion 514 is formed by being recessed in the upper edge of the gripping body 511 in the illustrated embodiment, corresponding to the position and shape of the identification protrusion 125.

The identification recessed portion 514 and the identification protrusion 125 may be complementarily formed. That is, in the illustrated embodiment, the identification protrusion 125 is formed in the housing 100 and the identification recessed portion 514 is formed in the slot member 500. Alternatively, the identification recessed portion 514 may be formed in the housing 100 and the identification protrusion 125 may be formed in the slot member 500.

In either case, it is sufficient if an operator may easily identify the insertion direction of the slot member 500 and the capacitor assembly 400 coupled thereto, that is, the up-down direction.

The slot body 520 forms a body of the slot member 500. The slot body 520 is coupled to the capacitor assembly 400 to support the capacitor assembly 400. The slot body 520 is guided by the guide member 300 and may be withdrawably accommodated in the housing 100.

The slot body 520 is formed to extend in the same direction as the capacitor assembly 400, that is, in the front-rear direction in the illustrated embodiment. It will be understood that the extension direction is the same as the direction in which the slot member 500 and the capacitor assembly 400 coupled thereto are drawn into or withdrawn from the housing 100.

The slot body 520 may be formed of a material having a predetermined elasticity. This is to be pressed by the capacitor assembly 400 to be deformed in shape and coupled to the capacitor assembly 400. In addition, as an external force is applied, the slot body 520 is deformed in shape and may be separated from the coupled capacitor assembly 400.

In an embodiment, the slot body 520 may be formed of a synthetic resin material, such as PC-ABS.

The slot body 520 is located in the insertion space S formed between the guide member 300 and the guide member 300. The slot body 520 may be drawn into or withdrawn from the insertion space S in a direction in which the guide member 300 extends, that is, in the front-rear direction in the illustrated embodiment.

The slot body 520 may be formed in a shape corresponding to the capacitor substrate 420. In the illustrated embodiment, the slot body 520 is formed in a quadrangular plate shape in which the extension length in the front-rear direction is longer than the extension length in the left-right direction, with a width in the up-down direction. A space surrounded by the gripping portion 510, a plurality of walls, and the latching protrusion 540 is formed inside the slot body 520. The capacitor assembly 400 may be accommodated in the space.

In the illustrated embodiment, the slot body 520 includes a first wall 521, a second wall 522, a third wall 523, and a capacitor accommodation portion 524.

The first wall 521 forms any one of the outer edges of the slot body 520. The first wall 521 is formed to extend in a direction in which the slot body 520 extends long and supports the capacitor assembly 400 coupled to the slot body 520 at one side. In the illustrated embodiment, the first wall 521 forms a left wall of the slot body 520. In the above embodiment, the first wall 521 is formed to extend in the front-rear direction.

The first wall 521 is coupled to the second guide member 300*b* of the guide member 300. The first wall 521 may slide in the extension direction of the guide body 310 while being inserted into the guide hollow 314 of the second guide member 300*b*.

The first wall 521 is formed to extend from the slot body 520 toward the capacitor assembly 400 by a predetermined length. In the illustrated embodiment, the first wall 521 is formed to extend upward by a predetermined length to surround the third edge 423 of the capacitor substrate 420 accommodated in the space.

The first wall 521 is disposed to be surrounded by a pair of capacitor support portions 530. In the illustrated embodiment, the first wall 521 is disposed alternately with the pair of capacitor support portions 530 in the extension direction, i.e., the front-rear direction thereof.

The first wall 521 is disposed to face the second wall 522 with the space interposed therebetween.

The second wall 522 forms another one of the outer edges of the slot body 520. The second wall 522 is formed to extend in a direction in which the slot body 520 extends long, and supports the capacitor assembly 400 coupled to the slot body 520 at another side. In the illustrated embodiment, the second wall 522 forms a right wall of the slot body 520. In the above embodiment, the second wall 522 is formed to extend in the front-rear direction.

The second wall 522 is coupled to the first guide member 300*a* of the guide member 300. The second wall 522 may slide in the extension direction of the guide body 310 while being inserted into the guide hollow 314 of the first guide member 300*a*.

The second wall 522 is formed to extend from the slot body 520 toward the capacitor assembly 400 by a predetermined length. In the illustrated embodiment, the second wall 522 is formed to extend upward by a predetermined length to surround the fourth edge 424 of the capacitor substrate 420 accommodated in the space.

The second wall 522 is disposed to be surrounded by a pair of capacitor support portions 530. In the illustrated embodiment, the second wall 522 is disposed alternately with the pair of capacitor support portions 530 in the extension direction, i.e., the front-rear direction thereof.

The first wall 521 and the second wall 522 are continuous with the third wall 523.

The third wall 523 forms yet another one of the outer edges of the slot body 520. The third wall 523 is formed to extend in the width direction of the slot body 520 and supports the capacitor assembly 400 coupled to the slot body 520 at yet another side. In the illustrated embodiment, the third wall 523 forms a front wall of the slot body 520. In the above embodiment, the third wall 523 is formed to extend in the left-right direction.

The third wall 523 may be disposed on the same surface as the slot body 520. In other words, the third wall 523 supports the capacitor assembly 400 from the lower side, but is formed not to restrain the capacitor assembly 400 in the other direction. This is due to the formation of a latching protrusion 540 on the third wall 523 to support one edge in the extension direction of the capacitor assembly 400, that is, the front edge in the illustrated embodiment.

The third wall 523 is coupled to the latching protrusion 540. The latching protrusion 540 is configured to support the one edge in the extension direction of the capacitor substrate 420.

The capacitor accommodation portion 524 is a space formed through the inside of the slot body 520. The capacitor accommodation portion 524 partially accommodates the capacitor 410. In the illustrated embodiment, the capacitor accommodation portion 524 is configured to partially accommodate a lower portion of the side surface of the capacitor 410.

The capacitor accommodation portion 524 may communicate with an opening formed in the capacitor substrate 420. The capacitor 410 may be accommodated in the opening and the capacitor accommodation portion 524, respectively.

The capacitor accommodation portion 524 may be provided in an arbitrary form that may partially accommodate the capacitor 410. In the illustrated embodiment, the capacitor accommodation portion 524 has a quadrangular cross-section in which the extension length in the front-rear direction is longer than the extension length in the left-right direction, and is formed through in the up-down direction.

A plurality of capacitor accommodation portions 524 may be provided. The plurality of capacitor accommodation portions 524 may be disposed to be spaced apart from each other to accommodate a plurality of different capacitors 410, respectively.

In the illustrated embodiment, a total of four capacitor accommodation portions 524 are provided, including a pair placed to be biased on the front side and another pair placed to be biased on the rear side.

The shape, number, and arrangement method of the capacitor accommodation portions 524 may be changed according to the shape, number, and arrangement method of the capacitors 410 provided.

The capacitor support portion 530 is a portion where the slot member 500 is coupled to the capacitor assembly 400. The capacitor support portion 530 supports the capacitor substrate 420 of the capacitor assembly 400.

The capacitor support portion 530 may be formed of a material having a predetermined elasticity. When the capacitor substrate 420 is inserted, the capacitor support portion 530 may be moved outward in the width direction by a predetermined distance, be deformed in shape, and store restoring force. When the coupling of the capacitor substrate 420 is completed, the capacitor support portion 530 may be restored to its shape before deformation by the restoring force and support the capacitor substrate 420.

That is, it may be said that the capacitor support portion 530 is snap-fitted to the capacitor substrate 420 to elastically support the capacitor substrate 420.

In an embodiment, the capacitor support portion 530 may be formed of a synthetic resin material, such as PC-ABS.

The capacitor support portion 530 may be formed at an edge of the slot body 520. In the illustrated embodiment, the capacitor support portion 530 is formed at a pair of edges in a direction in which the slot body 520 extends, that is, a left edge and a right edge, respectively. In other words, the capacitor support portion 530 is formed at each edge in the width direction of the slot body 520.

A plurality of capacitor support portions 530 may be provided. The plurality of capacitor support portions 530 may be formed at the edges of the slot body 520, respectively.

In the illustrated embodiment, the capacitor support portion 530 formed at the left edge of the slot body 520 is formed in a pair and arranged side by side to face each other with the first wall 521 interposed therebetween. That is, the capacitor support portions 530 formed at the left edge of the slot body 520 are disposed to be spaced apart from each other in the length direction of the slot body 520.

In addition, in the illustrated embodiment, the capacitor support portion 530 formed at the right edge of the slot body 520 is also formed in a pair and arranged side by side to face each other with the second wall 522 interposed therebetween. That is, the capacitor support portions 530 formed at the right edge of the slot body 520 are also disposed to be spaced apart from each other in the length direction of the slot body 520.

Therefore, the capacitor assembly 400 coupled to the slot member 500, specifically the capacitor substrate 420 may be supported by the capacitor support portions 530 at multiple positions. Accordingly, the coupling state between the capacitor assembly 400 and the slot member 500 can be stably maintained.

In the illustrated embodiment, the capacitor support portion 530 includes a support body 531 and a support protrusion 532.

The support body 531 is a portion where the capacitor support portion 530 is coupled to the slot body 520. The support body 531 is formed to extend in a direction from an edge of the slot body 520 toward the capacitor assembly 400, i.e., upward in the illustrated embodiment. In other words, the support body 531 is formed to protrude in the same direction as the first wall 521 or the second wall 522.

The support body 531 is formed to partially surround the capacitor substrate 420 from the outside. That is, the support body 531 formed at the left edge of the slot body 520 partially surrounds the left edge of the capacitor substrate 420, that is, the third edge 423. In addition, the support body 531 formed at the right edge of the slot body 520 partially surrounds the right edge of the capacitor substrate 420, that is, the fourth edge 424.

The support body 531 is formed to extend by a predetermined length in a direction in which the slot body 520 extends, that is, in the front-rear direction in the illustrated embodiment. In this case, the support body 531 may be shorter than an extension length of the first wall 521 or the second wall 522 in the same direction.

A support protrusion 532 is formed to protrude inward from the support body 531.

The support protrusion 532 supports the capacitor assembly 400 seated in the slot body 520, particularly, the capacitor substrate 420. In an embodiment, the support protrusion 532 may support the capacitor substrate 420 by pressing downward.

The support protrusion 532 is formed to extend inward from the support body 531. In the illustrated embodiment, the support protrusion 532 of the capacitor support portion 530 positioned at the left edge of the slot body 520 is formed to extend toward the right side. In addition, the support protrusion 532 of the capacitor support portion 530 positioned at the right edge of the slot body 520 is formed to extend toward the left side.

The support protrusion 532 is disposed to be spaced apart from one end where the support body 531 is coupled to the slot body 520, that is, the lower end in the illustrated embodiment, by a predetermined distance. In an embodiment, a separation distance between the support protrusion 532 and the one end may be formed to be greater than or equal to a thickness of the capacitor substrate 420.

That is, each edge of the capacitor substrate 420 in the extension direction, i.e., the third edge 423 on the left and the fourth edge 424 on the right in the illustrated embodiment, is supported by one surface of the support protrusion 532 and the slot body 520. It will be understood that the one surface of the slot body 520 is an upper surface facing the capacitor substrate 420.

The support protrusion 532 may have an arbitrary shape capable of supporting the capacitor substrate 420 by pressing the one surface of the slot body 520. In the illustrated embodiment, the support protrusion 532 is formed to have an extension length in the front-rear direction longer than an extension length in the up-down direction and a thickness in the left-right direction.

In this case, each edge of the support protrusion 532 in the up-down direction may be chamfered. Accordingly, the capacitor substrate 420 can be easily inserted by pressing the support protrusion 532 outward. In addition, the capacitor substrate 420 can be easily removed from the slot member 500 when the support protrusion 532 is moved outward by an external force.

That is, the capacitor assembly 400 may be snap-fitted to the slot member 500 by the support protrusion 532. In other words, the capacitor assembly 400 and the slot member 500 are elastically coupled to each other.

The latching protrusion 540 supports one side in the extension direction of the capacitor assembly 400 coupled to the slot member 500. The capacitor assembly 400 may be withdrawn from the housing 100 together with the slot member 500 by the latching protrusion 540.

The latching protrusion 540 is coupled to the slot body 520. The latching protrusion 540 is formed to extend outward from one end in the extension direction of the slot body 520. In the illustrated embodiment, the latching protrusion 540 is formed to extend toward the front from the third wall 523 formed at the front end of the slot body 520.

A plurality of latching protrusions 540 may be provided. The plurality of latching protrusions 540 may be disposed to be spaced apart from each other in the width direction of the slot body 520. In the illustrated embodiment, two latching protrusions 540 are provided and disposed to be spaced apart from each other in the extension direction of the third wall 523, that is, in the left-right direction.

A space formed between the plurality of latching protrusions 540 communicates with the support space portion 452. In addition, the capacitor connector 430 is located in the space formed between the plurality of latching protrusions 540. As the capacitor assembly 400 and the slot member 500 are moved, the connector 220 may be accommodated in the space.

The plurality of latching protrusions 540 may support the one end of the capacitor substrate 420 at different positions. In the illustrated embodiment, the plurality of latching protrusions 540 support the second edge 422 from the left and right sides, respectively. Therefore, when the slot member 500 is withdrawn from the housing 100, the capacitor assembly 400 may be withdrawn together with the slot member 500 by being supported its front edge (i.e., the second edge 422) by the plurality of latching protrusions 540.

In the illustrated embodiment, the latching protrusion 540 includes a first extension 541, a second extension 542, and a third extension 543.

The first extension 541 is a portion where the latching protrusion 540 is continuous with the slot body 520. The first extension 541 is formed to extend outward from the third wall 523 of the slot body 520, that is, toward the front side in the illustrated embodiment.

It is preferable that the first extension 541 extends sufficiently that the capacitor substrate 420 is completely accommodated on the upper surface of the slot body 520. In an embodiment, a distance between one end of the first extension 541 in the extension direction, that is, the front end in the illustrated embodiment, and the gripping portion 510 may be greater than or equal to a length of the capacitor substrate 420 in the front-rear direction.

The first extension 541 is continuous with the second extension 542. The first extension 541 and the second extension 542 are continuous at a predetermined angle. In an embodiment, the predetermined angle may be a right angle.

The second extension 542 is where the latching protrusion 540 supports one end in the extension direction of the capacitor substrate 420. The second extension 542 is continuous at a predetermined angle with the first extension 541.

The second extension 542 may be extended by a length greater than or equal to the thickness of the capacitor substrate 420. Specifically, it is preferable that the second extension 542 extends so that a distance between one side facing the slot body 520, that is, the lower end of the third extension 543 formed on the rear side in the illustrated embodiment, and the upper surface of the slot body 520 is greater than or equal to the thickness of the capacitor substrate 420.

The third extension 543 is positioned on one surface of the surfaces of the second extension 542 toward the slot body 520, i.e., on the rear side surface in the illustrated embodiment.

The third extension 543 supports the capacitor substrate 420 seated on the slot body 520 at one side in the thickness direction thereof, i.e., at the upper side in the illustrated embodiment. Thanks to the third extension 543, the second edge 422 of the capacitor substrate 420 is not arbitrarily separated from the slot member 500.

The third extension 543 extends from the one surface of the second extension 542, that is, the front side in the illustrated embodiment, toward the slot body 520, that is, toward the rear side. The third extension 543 extends by a predetermined length from one end in the extension direction of the second extension 542, i.e., from the upper end in the illustrated embodiment, toward the rear side and the lower side.

The third extension 543 may have an arbitrary shape capable of supporting the second edge 422 of the capacitor substrate 420 seated in the slot body 520 from the upper side. In the illustrated embodiment, the third extension 543 is formed such that the upper end thereof is continuous with the upper end of the second extension 542 and the lower end thereof is spaced apart from the upper surface of the first extension 541 by a predetermined distance.

In this case, the distance between the lower end of the third extension 543 and the upper surface of the first extension 541 is preferably formed to be greater than or equal to the thickness of the capacitor substrate 420.

3. Description of the Coupling Process of the Power Electronic Apparatus 10 According to an Exemplary Embodiment of the Present Disclosure In the power electronic apparatus 10 according to an exemplary embodiment of the present disclosure described above, the capacitor assembly 400 may be modularized and coupled to the housing 100. In this case, the capacitor assembly 400 may be supported by the slot member 500, be guided by the guide member 300, and be inserted into and coupled to the housing 100.

At the same time, as the capacitor assembly 400 is inserted into the housing 100, the capacitor assembly 400 may also be coupled to the PCB assembly 200 to be energized with the PCB assembly 200.

In the above process, no separate fastening member or tool is required. Accordingly, the installation and separation process may be easily performed.

Furthermore, as the capacitor assembly 400 is modularized and provided, the plurality of capacitor assemblies 400 can be operated and maintained independently. Therefore, even when the capacitor assembly 400 is separated and maintained, power-off of the power electronic apparatus 10 is not required, and thus work convenience may be improved.

Hereinafter, a coupling process of the power electronic apparatus 10 according to an exemplary embodiment of the present disclosure will be described in detail with reference to FIGS. 18 to 24.

In the illustrated embodiment, a process in which the capacitor assembly 400 and the slot member 500 are coupled to the housing 100 and the PCB assembly 200 is illustrated. It will be understood that a process of separating the capacitor assembly 400 and the slot member 500 from the housing 100 and the PCB assembly 200 may be performed in reverse according to the illustrated embodiment.

Referring to FIGS. 18 to 21, a process in which the capacitor assembly 400 and the slot member 500 are coupled to the PCB assembly 200 and the capacitor assembly 400 and the PCB assembly 200 are energized is illustrated. For convenience of understanding and description, the illustration of the housing 100 is omitted.

Prior to the above process, a process of coupling the capacitor assembly 400 and the slot member 500 may be performed. By the above coupling, the capacitor 410 may be partially accommodated in the capacitor accommodation portion 524, and each edge of the capacitor substrate 420 may be supported by different components of the slot member 500.

Specifically, the first edge 421 of the capacitor substrate 420 may be supported by the gripping portion 510, and the second edge 422 may be supported by the latching protrusion 540. In addition, the third edge 423 may be supported by the first wall 521 and the capacitor support portion 530 adjacent to it, and the fourth edge 424 may be supported by the second wall 522 and the capacitor support 530 adjacent to it.

In this case, the capacitor support portion 530 is snap-fitted to the third edge 423 and the fourth edge 424 of the capacitor substrate 420 to elastically support the capacitor substrate 420. In addition, the latching protrusion 540 supports the second edge 422 of the capacitor substrate 420.

The capacitor assembly 400 and the slot member 500 coupled thereto are moved toward the PCB assembly 200 to enter the insertion space S. In the illustrated embodiment, the capacitor assembly 400 and the slot member 500 coupled thereto are moved toward the rear side to be coupled to the PCB assembly 200.

In this case, each edge in the extension direction of the capacitor assembly 400 and the slot member 500 coupled thereto is supported by the first guide member 300*a* and the second guide member 300*b*. Left and right edges of the capacitor assembly 400, that is, the third and fourth edges 423 and 424 and left and right edges of the slot member 500 are inserted into the guide hollows 314 of the first and second guide members 300*a* and 300*b*, respectively.

The capacitor assembly 400 and the slot member 500 coupled thereto are moved in the extension direction of the guide member 300, i.e., toward the rear side in the illustrated embodiment. In this case, the capacitor assembly 400 and the slot member 500 coupled thereto may be coupled to the guide member 300 by forming a predetermined gap in the width direction, that is, in the up-down direction in the illustrated embodiment.

Therefore, even when the capacitor assembly 400 and the slot member 500 coupled thereto are accommodated in the guide member 300 while forming a predetermined error, the capacitor assembly 400 and the slot member 500 coupled thereto can be guided and moved by the guide member 300.

Meanwhile, when the capacitor assembly 400 and the slot member 500 coupled thereto are inserted into the guide member 300, the capacitor connector 430 may be disposed on the same straight line as the connector 220. Accordingly, when the capacitor assembly 400 and the slot member 500 coupled thereto continue to be moved toward the connector 220, the capacitor connector 430 may be inserted into and coupled to the connector 220 to be energized.

Figure 21:
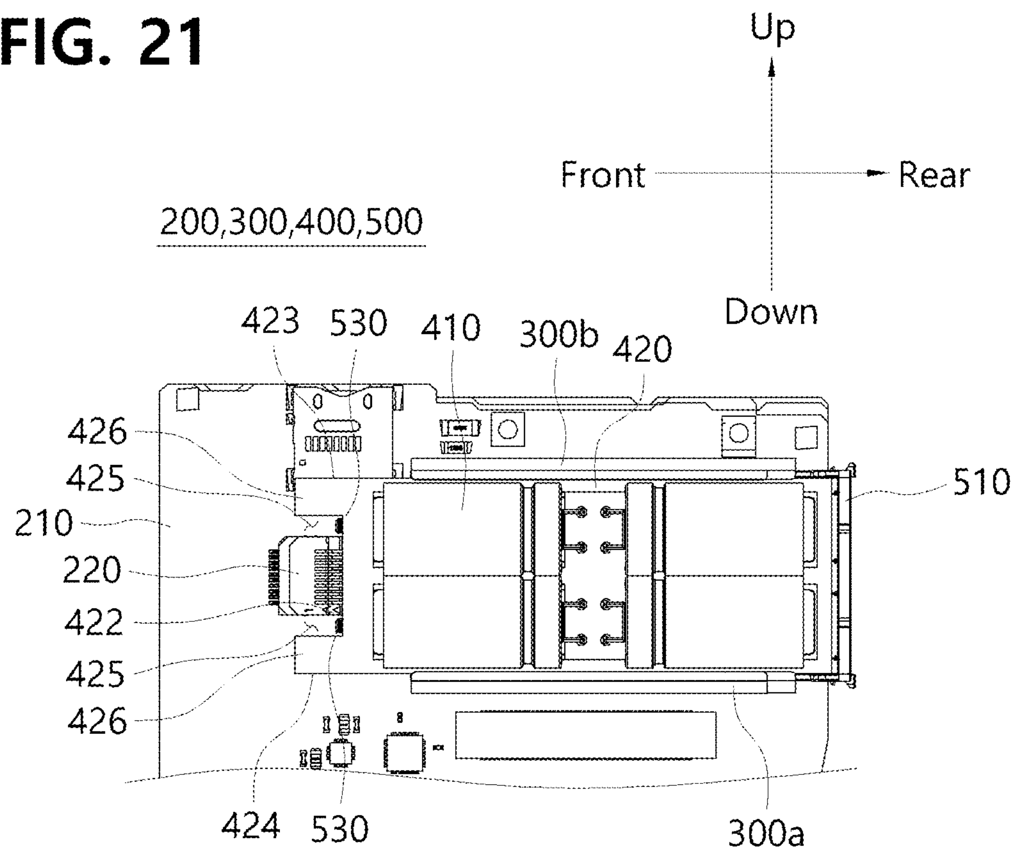
FIG. 21 is a side view illustrating a state in which the PCB assembly and the capacitor assembly of FIG. 3 are coupled to each other.

As illustrated in FIG. 21, the capacitor assembly 400 and the slot member 500 coupled thereto have upper and lower edges accommodated in and supported by the first guide member 300*a* and the second guide member 300*b*, respectively. In this case, the capacitor connector 430 is inserted into the connector 220 so that the capacitor assembly 400 and the PCB assembly 200 are energized.

The connector 220 is accommodated in a pair of support space portions 425 formed between the pair of support extensions 426, that is, a pair of support space portions 425 partitioned by the capacitor connector 430.

Therefore, the capacitor assembly 400 and the PCB assembly 200 may be combined and energized only by the process of moving the capacitor assembly 400 and the slot member 500 coupled thereto along the guide member 300. As described above, a separate fastening member or tool is not required in the process.

Figure 22:
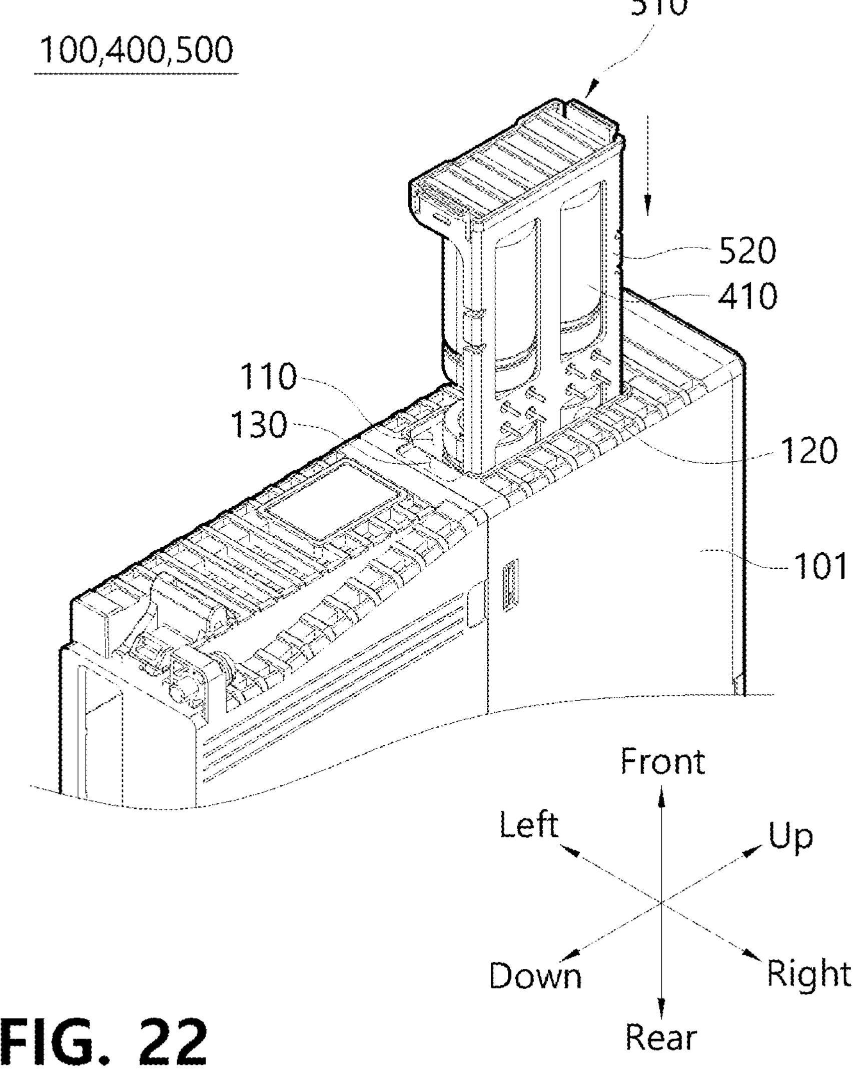
FIG. 22 is a perspective view illustrating a process in which the capacitor assembly of FIG. 3 is coupled to the housing of FIG. 4.
Figure 23:
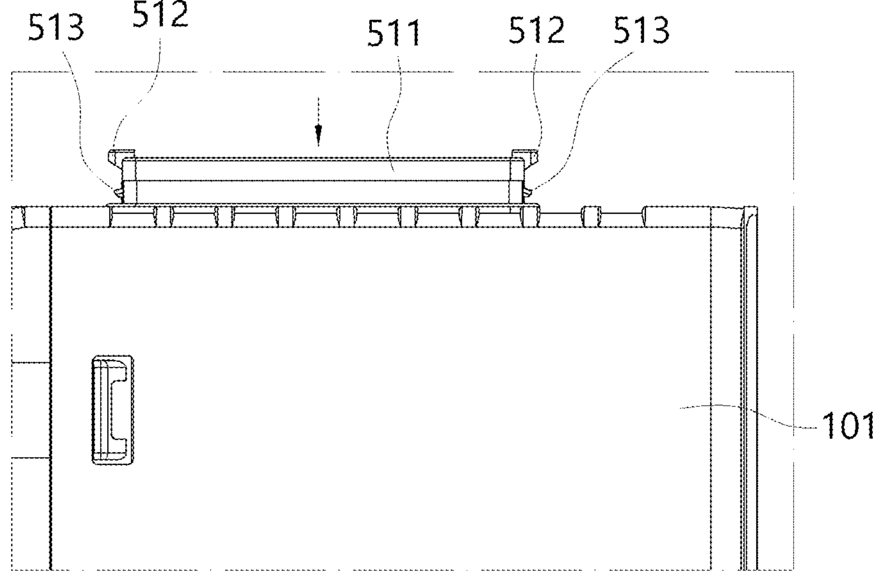
FIG. 23 is a side view illustrating a process in which the capacitor assembly of FIG. 3 is coupled to the housing of FIG. 4.

Referring to FIGS. 22 to 24, a process in which the capacitor assembly 400 and the slot member 500 coupled thereto are coupled to the housing 100 is illustrated. For convenience of understanding, illustrations of the PCB assembly 200 and the guide member 300 are omitted.

It will be understood that the illustrated coupling process is performed simultaneously with the process of coupling and moving the capacitor assembly 400 and the slot member 500 coupled thereto with the PCB assembly 200 and the guide member 300.

That is, FIGS. 18 to 21 illustrate a process in which the capacitor assembly 400 and the slot member 500 coupled thereto are coupled to the PCB assembly 200 and the guide member 300 accommodated in the housing 100.

In addition, FIGS. 22 to 24 illustrate a process in which the capacitor assembly 400 and the slot member 500 coupled thereto are coupled to the housing 100.

The capacitor assembly 400 and the slot member 500 coupled thereto are drawn into the housing 100 through the insertion opening 110. In this case, one end where the capacitor connector 430 coupled to the PCB assembly 200 is located, that is, the rear end in the illustrated embodiment, first enters the accommodation space 104 through the insertion opening 110.

In this case, the identification protrusion 125 is formed in the housing 100 and the identification recessed portion 514 is formed in the slot member 500. Accordingly, it can be easily recognized that the capacitor assembly 400 and the slot member 500 should be inserted in a direction in which the identification protrusion 125 and the identification recessed portion 514 align. In the illustrated embodiment, the capacitor assembly 400 and the slot member 500 are drawn into the housing 100 such that the identification recessed portion 514 is located on the left side.

As the drawing-in process of the capacitor assembly 400 and the slot member 500 proceeds, the insertion protrusion 513 comes into contact with the support frame 120. According to the shape of the insertion protrusion 513, that is, a shape chamfered in the thickness direction, the insertion protrusion 513 is pressed inward by the support frame 120 and is drawn into the accommodation space 104.

In this case, the pressing protrusion 512 is also pressed in an inward direction together with the insertion protrusion 513, and is drawn into the accommodation space 104.

When the drawing-in of the capacitor assembly 400 and the slot member 500 is completed, the insertion protrusion 513 is moved to the rear side of the support frame 120. Accordingly, the external force applied by the support frame 120 to the insertion protrusion 513 is released.

In the above state, the insertion protrusion 513 and the pressing protrusion 512 coupled thereto are restored to their original shape and are moved in an outward direction. Accordingly, the insertion protrusion 513 is supported by the rear side of the support frame 120. Accordingly, the capacitor assembly 400 and the slot member 500 are restricted from moving in the direction of withdrawal from the housing 100, that is, toward the front side in the illustrated embodiment.

In the above state, the pressing protrusions 512 are respectively accommodated in the gripping space portion 130. The gripping space portion 130 is formed to have a larger volume than the pressing protrusion 512. In particular, the gripping space portion 130 extends by a length larger than the pressing protrusion 512 in a direction toward the inside of the pressing protrusion 512, that is, in the up-down direction in the illustrated embodiment. Therefore, an operator may insert a finger into the gripping space portion 130 and press the pressing protrusion 512 inward to move the insertion protrusion 513 inward.

In addition, in the above state, the outer surface (i.e., the front surface) of the gripping portion 510 and the outer surface (i.e., the front surface) of the housing 100 may be located on the same plane. Therefore, the slot member 500 and the capacitor assembly 400 coupled thereto do not protrude outward.

Figures 17, 18:
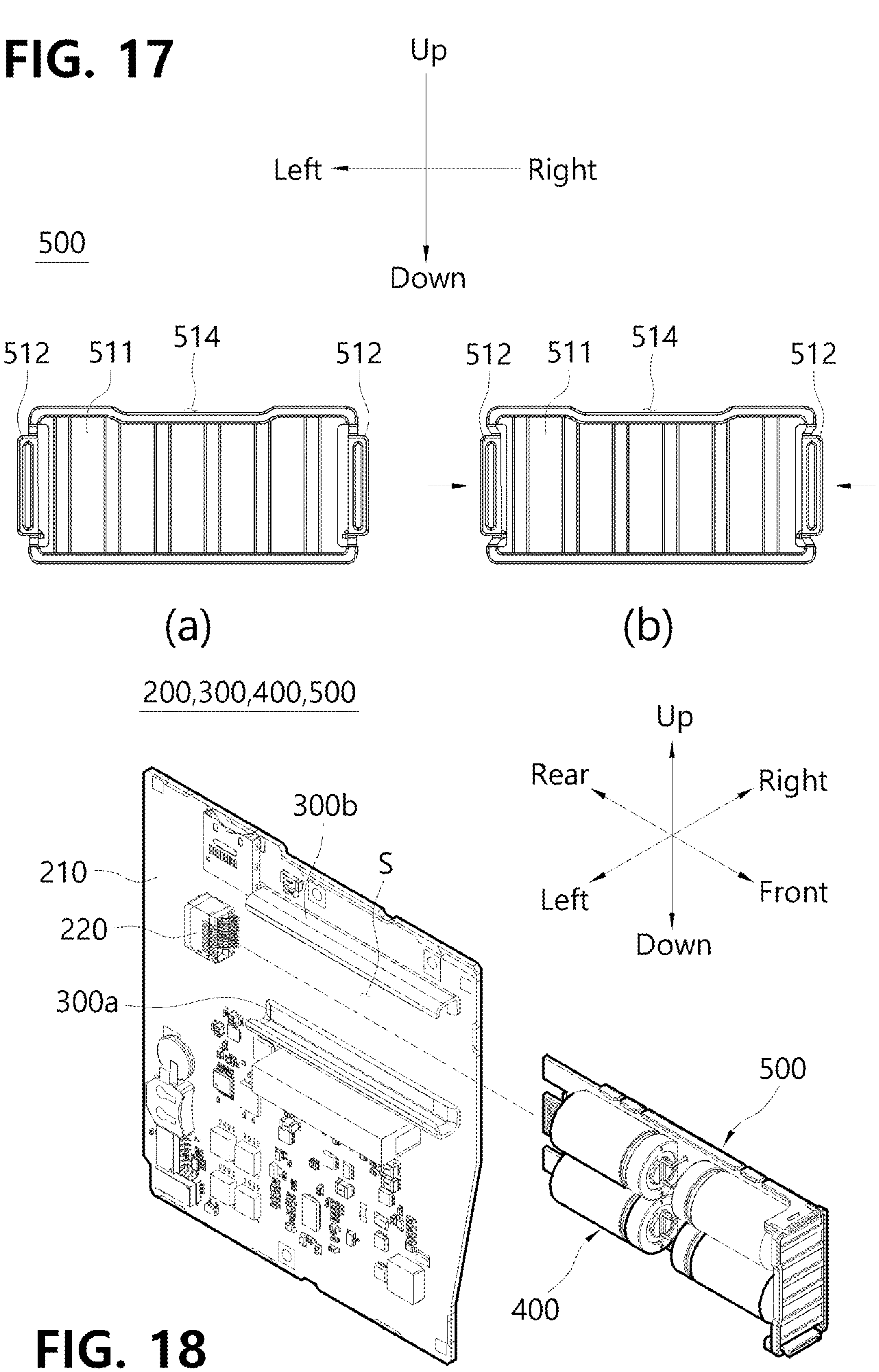
FIG. 17 is a front view illustrating an operating state of a gripping portion provided in the slot member of FIG. 14.
FIGS. 18 to 20 are exploded perspective views illustrating a process in which the PCB assembly and the capacitor assembly of FIG. 3 are coupled to each other.
Figure 19:
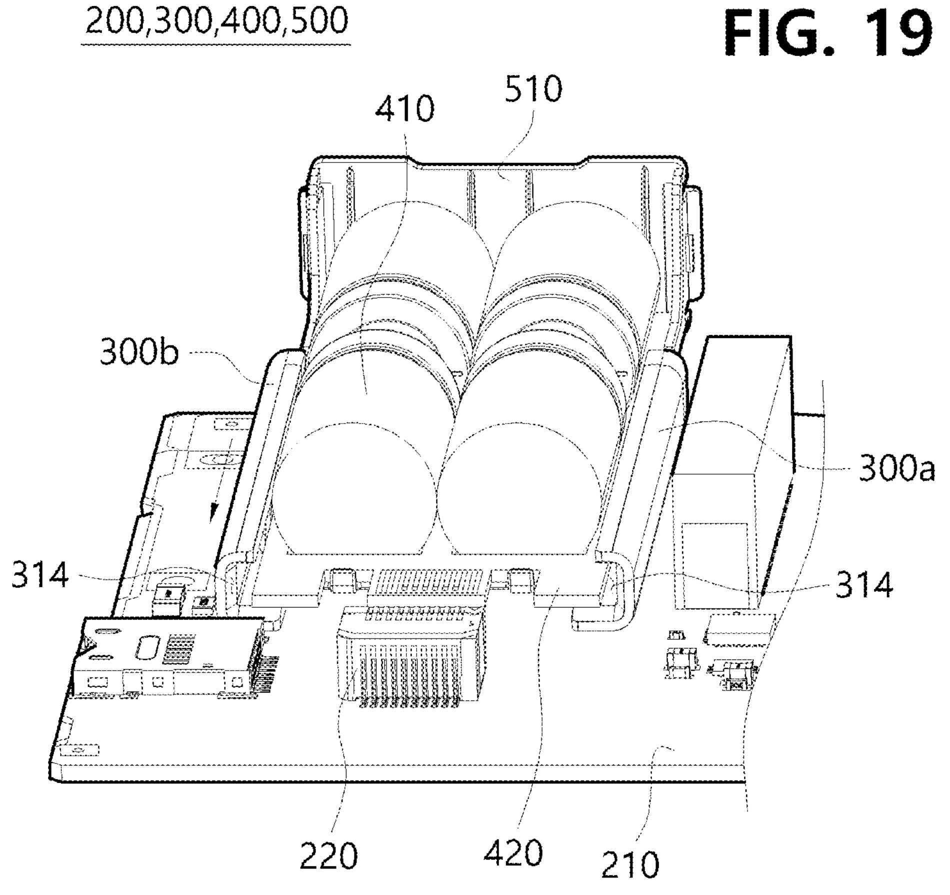
Figure 20:
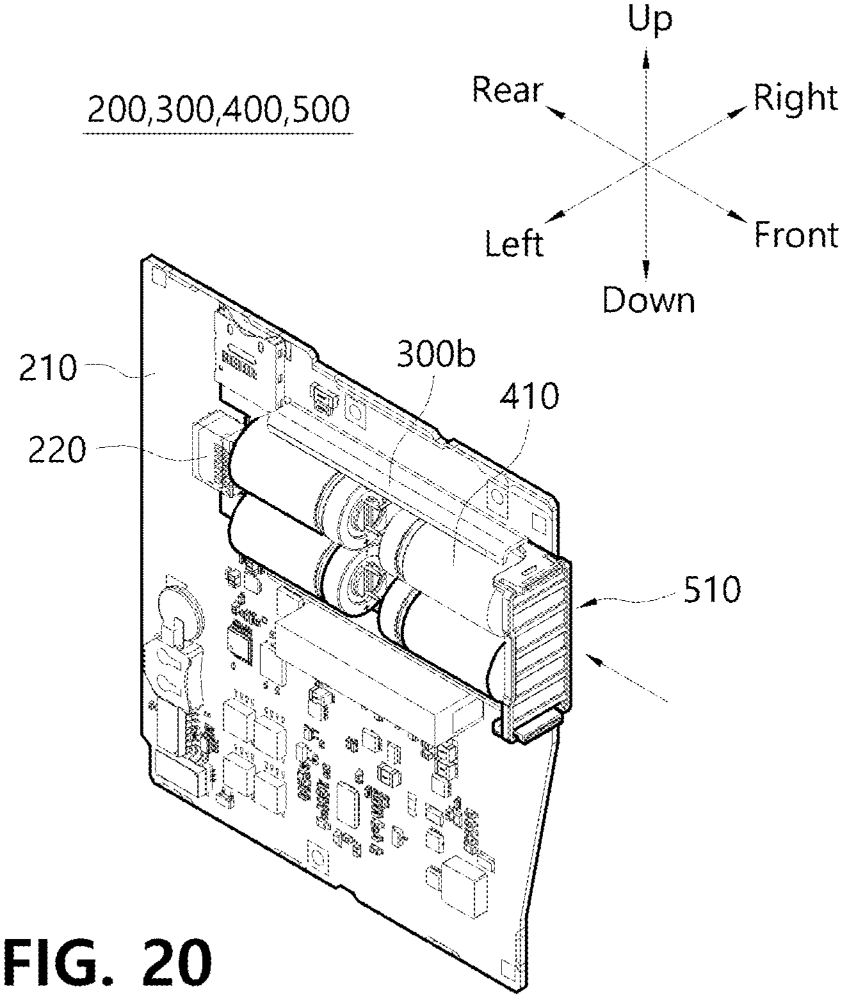

Meanwhile, in order to separate the slot member 500 and the capacitor assembly 400 coupled thereto from the housing 100, the restraint state of the insertion protrusion 513 by the support frame 120 must be released. To this end, as shown in FIG. 17, it will be understood that when the pressing protrusion 512 is pressed inward, the insertion protrusion 513 may also be moved inward to release the restraint state.

Although exemplary embodiments of the present disclosure have been described, the idea of the present disclosure is not limited to the embodiments set forth herein. Those of ordinary skill in the art who understand the idea of the present disclosure may easily propose other embodiments through supplement, change, removal, addition, etc. of elements within the same idea, but the embodiments will be also within the scope of the present disclosure.

<Description of Symbols>

10: power electronic apparatus
100: housing
101: upper housing
102: lower housing
103: operation button
104: accommodation space
110: insertion opening
120: support frame
121: first portion
122: second portion
123: third portion
124: fourth portion
125: identification protrusion
130: gripping space portion
131: first gripping space portion
132: second gripping space portion
200: PCB assembly
210: PCB substrate
211: PCB through hole
220: connector
300: guide member
300a: first guide member
300b: second guide member
310: guide body
311: first extension
312: second extension
313: third extension
314: guide hollow
315: guide inclined portion
320: coupling protrusion
320a: first coupling protrusion
320b: second coupling protrusion
321: protrusion extension
322: protrusion head portion
322a: head end
322b: head inclined portion
322c: head extension
400: capacitor assembly
410: capacitor
420: capacitor substrate
421: first edge
422: second edge
423: third edge
424: fourth edge
425: support space portion
426: support extension
430: capacitor connector
500: slot member
510: gripping portion
511: gripping body
512: pressing protrusion
513: insertion protrusion
514: identification recessed portion
520: slot body
521: first wall -continued

| <Description of Symbols> |
| --- |
| 522: second wall |
| 523: third wall |
| 524: capacitor accommodation portion |
| 530: capacitor support portion |
| 531: support body |
| 532: support protrusion |
| 540: latching protrusion |
| 541: first extension |
| 542: second extension |
| 543: third extension |
| g: separation distance |
| S: insertion space |

What is claimed is:

1. A slot member, comprising:

a slot body on which a capacitor assembly is seated and which supports the capacitor assembly;

a gripping portion continuously formed from one end of the slot body; and a capacitor support portion coupled to the slot body and configured to support an edge of the capacitor assembly, wherein the slot body extends in one direction and is inserted into and coupled to an external housing to be withdrawable therefrom, and the gripping portion is disposed to be exposed to an outside of the external housing, and wherein the gripping portion is coupled to one end in an extension direction of the slot body, and at another end in the extension direction of the slot body, a latching protrusion extends from the slot body and supports one end of the capacitor assembly, and wherein the slot body is configured to be retracted into or extended from the external housing along the extension direction of the slot body.

2. The slot member of claim 1, wherein the slot body comprises:

a first wall formed at one edge in the extension direction of the slot body and surrounding one edge of the capacitor assembly from the outside; and a second wall formed at another edge in the extension direction of the slot body, disposed to face the first wall with the seated capacitor assembly therebetween, and surrounding the one edge of the capacitor assembly from the outside.

3. The slot member of claim 1, wherein a plurality of said capacitor support portions are provided, any one or more of the plurality of capacitor support portions are formed at one edge in the extension direction of the slot body and configured to support one edge of the capacitor assembly, and another one or more of the plurality of capacitor support portions are formed at another edge in the extension direction of the slot body and configured to support another edge of the capacitor assembly.

4. The slot member of claim 1, wherein the capacitor support portion comprises:

a support body coupled to the slot body and formed to extend in a thickness direction of the slot body to surround an edge of the capacitor assembly; and a support protrusion protruding from one surface of the surfaces of the support body facing the capacitor assembly and disposed to face the slot body with the capacitor assembly therebetween.

5. The slot member of claim 4, wherein the support protrusion has one edge that is chamfered, facing the seated capacitor assembly and another edge that is chamfered, opposite to the capacitor assembly.

6. The slot member of claim 1, wherein the latching protrusion comprises:

a first extension extending from another end of the slot body along the one direction;

a second extension continuous with an end of the first extension, forming a predetermined angle with the first extension and extending in a thickness direction of the slot body to surround the one end of the capacitor assembly; and a third extension protruding from one surface of the surfaces of the second extension facing the capacitor assembly and disposed to face the first extension with the capacitor assembly therebetween.

7. The slot member of claim 1, wherein a capacitor accommodation portion formed is formed through inside the slot body in a thickness direction to accommodate a capacitor of the capacitor assembly.

8. A power electronic apparatus, comprising:

a housing with an accommodation space formed therein;

a PCB assembly accommodated in the accommodation space and mounted inside the housing, and configured to not be exposed to an outside of the housing;

a capacitor assembly which is inserted into the accommodation space to be withdrawable therefrom, is coupled to the PCB assembly, and is energized with the PCB assembly to transmit stored power; and a slot member coupled to the capacitor assembly to support the capacitor assembly, inserted into the accommodation space to be withdrawable together with the capacitor assembly, and detachably coupled to the housing, and wherein the PCB assembly is coupled with the capacitor assembly inserted into the accommodation space together with the slot member.

9. The power electronic apparatus of claim 8, comprising a guide member coupled to the PCB assembly and extending in one direction to guide a slide movement of the capacitor assembly and the slot member, wherein each of the capacitor assembly and the slot member is formed to extend in the one direction and is moved in the one direction to be inserted into the accommodation space.

10. The power electronic apparatus of claim 9, wherein the guide member comprises:

a guide body that extends in the one direction and has a guide hollow therein that penetrates in the one direction to accommodate the capacitor assembly and the slot member; and a coupling protrusion that is continuous with the guide body and is coupled to the PCB assembly.

11. The power electronic apparatus of claim 10, wherein the PCB assembly comprises:

a PCB through hole formed through in a thickness direction, and a PCB substrate energized with the capacitor assembly, and wherein the coupling protrusion comprises:

a protrusion extension that penetrates the PCB through hole and extends from the guide body; and a head extension that is continuous with an end of the protrusion extension and is formed to have a diameter larger than that of a cross-section of the PCB through hole.

12. The power electronic apparatus of claim 11, wherein the protrusion extension is formed to extend by a length equal to or greater than the thickness of the PCB substrate, and a portion of the protrusion extension is located outside the protrusion extension.

13. The power electronic apparatus of claim 9, wherein a plurality of said guide members are provided, and the plurality of guide members are disposed to be spaced apart from each other along another direction forming a predetermined angle with the one direction, and a separation distance between the plurality of guide members is greater than or equal to a length of the capacitor assembly and the slot member in the other direction.

14. The power electronic apparatus of claim 10, wherein the guide body comprises:

a first extension formed to extend in the one direction and surround the guide hollow on one side to support the accommodated capacitor assembly and the slot member on another direction;

a second extension formed to extend in the one direction, be continuous with the first extension, and surround the guide hollow on another side to support the accommodated capacitor assembly and slot member on one side in a thickness direction thereof; and a third extension formed to extend in the one direction, be continuous with the first extension, be disposed to face the second extension with the guide hollow interposed therebetween, and surround the guide hollow on the side to support the accommodated capacitor assembly and the slot member on the one side in the thickness direction thereof.

15. The power electronic apparatus of claim 8, wherein the slot member comprises:

a gripping portion detachably coupled to the housing, and wherein the housing comprises:

an insertion opening formed open and through which the capacitor assembly and the slot member pass, and which is covered by the gripping portion; and a support frame surrounding the insertion opening and detachably coupled to the gripping portion.

16. The power electronic apparatus of claim 15, wherein the gripping portion comprises:

a gripping body that covers the insertion opening and is formed to extend in one direction;

a pressing protrusion located adjacent to each end in an extension direction of the gripping body and configured to be movable toward said each end of the gripping body by an external force; and an insertion protrusion coupled to the pressing protrusion, protruding outward in the one direction, moving with the pressing protrusion, and detachably coupled to the support frame, and wherein the pressing protrusion and the insertion protrusion are formed of a material having a predetermined elasticity, and return to a position before movement when the external force is released.

17. The power electronic apparatus of claim 16, wherein the pressing protrusion and the insertion protrusion are formed of a polycarbonate acrylo-nitrile-butadiene-styrene (PC-ABS) material.

18. The power electronic apparatus of claim 15, wherein the support frame comprises:

an identification protrusion partially surrounding the insertion opening and protruding toward the insertion opening, and wherein the gripping portion comprises:

an identification recessed portion that forms a portion of an outer circumference thereof and is formed to align with the identification protrusion.

19. The power electronic apparatus of claim 8, wherein the PCB assembly comprises:

a PCB substrate located in the accommodation space and provided in a plate shape;

and a connector coupled to the PCB substrate and energized with the PCB substrate, and wherein a plurality of guide members extending in one direction are disposed to be spaced apart from each other along the other direction on the PCB substrate, the capacitor assembly and the slot member are formed to extend in the one direction, and each edge in the other direction is accommodated in and supported by the plurality of guide members, respectively, the capacitor assembly comprises a capacitor connector positioned at an end in the one direction and detachably coupled to the connector, and when the capacitor assembly and the slot member are accommodated in the accommodation space along the one direction, the capacitor connector is coupled to the connector so that the capacitor assembly and the PCB assembly are energized.

* * * * *